United States Patent [19]
Ker et al.

[11] Patent Number: 5,959,820
[45] Date of Patent: Sep. 28, 1999

[54] CASCODE LVTSCR AND ESD PROTECTION CIRCUIT

[75] Inventors: Ming-Dou Ker, Hsinchu; Hun-Hsien Chang, Taipei, both of Taiwan

[73] Assignee: Taiwan Semiconductor Manufacturing Co., Ltd., Hsinchu, Taiwan

[21] Appl. No.: 09/064,894

[22] Filed: Apr. 23, 1998

[51] Int. Cl.[6] .................................... H02H 3/22
[52] U.S. Cl. ............................. 361/111; 361/56
[58] Field of Search ................... 361/56, 91, 111

[56] References Cited

U.S. PATENT DOCUMENTS

| | | | |
|---|---|---|---|
| 4,075,510 | 2/1978 | Pascente | 327/456 |
| 4,571,535 | 2/1986 | Gyugyi | 323/211 |
| 5,528,188 | 6/1996 | Au et al. | 327/310 |
| 5,572,394 | 11/1996 | Ker et al. | 361/56 |
| 5,754,381 | 5/1998 | Ker | 361/56 |

Primary Examiner—Michael J. Sherry
Attorney, Agent, or Firm—Harold L. Novick; Nath & Associates

[57] ABSTRACT

The cascode LVTSCR includes two or more SCRs (silicon controlled rectifiers). Each SCR has an anode, a control gate, and a cathode. The SCRs are cascoded in series by coupling the control gates of same type SCRs in common and coupling the cathode of one SCR to the anode of next SCR in series. The holding voltage of the cascode LVTSCR can be designed to be greater than VDD voltage level of the IC. Therefore, the cascode LVTSCR has no latchup problem in the CMOS IC's. The electrostatic discharge (ESD) protection circuit in the present invention includes a cascode LVTSCR (low-voltage triggering silicon controlled rectifier) with an anode and a cathode coupled between power supplies, and a detecting circuit coupled between the power supplies for detecting an electrostatic charge to trigger the control gates of the cascode LVTSCR for dissipating the electrostatic discharge. The ESD protection circuit including the cascode LVTSCR can sustain high ESD stress but without causing the latchup problem in the CMOS IC's.

56 Claims, 26 Drawing Sheets

CASCODE LVTSCR AND ESD PROTECTION CIRCUIT

FIELD OF THE INVENTION

The present invention relates to SCRs (silicon controlled rectifiers), and more specifically, to a cascode LVTSCR (low-voltage triggering silicon controlled rectifier) and an electrostatic discharge (ESD) protection circuit utilizing the cascode LVTSCR.

BACKGROUND OF THE INVENTION

In the integrated circuits or semiconductor devices, transistors and especially metal oxide semiconductor (MOS) transistors, are the most vital element in the applications. However with the continuous narrowing of device size, the submicron scale MOS transistors have to face lots of risky challenges. As the MOS transistors become narrower and thinner, the ability in tolerating the unexpected or non-operational signals becomes a considerable factor. The integrated circuits have to tolerate the non-operational discharge like electrostatic discharge (ESD) without the reliability and the functionality being damaged.

The electrostatic discharge (ESD) attacking has became a serious problem with the down scaling of the feature size of the MOS transistors. A semiconductor device having the power supplies and the input/output pad connections with external sources and circuitry is subject to the problem of ESD. ESD is easily conducted through the input/output and the power lead connections into the internal devices of the integrated circuits and causes the problems like the gate oxide rupture and the overheat damages. The high voltage gradient generated between the contacts and the channels from ESD causes the gate oxide electron injection and the carrier accelerations in the channels. The characteristics and operations of the devices are easily influenced by the inducing effects of ESD. A high level of ESD with several hundred volts to a few thousand volts, which is easily transferred to the pins of an IC package during the handling, can bring a permanent destruction to the internal devices of the IC. For preventing the devices from ESD damaging, the built-in ESD protection circuits are connected between the input/output pads and the internal circuitry. A high level of abnormal discharge conducted into the pins of an IC package is kept out by the ESD protection circuits from flowing into the devices. The discharges are guided through the ESD protection circuits to the substrate or ground and the damage to the semiconductor devices is eliminated.

The SCR (silicon controlled rectifier) device has been well known as one of the most effective ESD protection elements for the input and output pins of the CMOS (complementary MOS) IC's (integrated circuits). The SCR device has a great bypassing current at latch-up state and thus makes it the most efficient device in protecting ESD with limited area. The drawback of high triggering voltage of conventional SCR device had been eliminated with the LVTSCR (low-voltage triggering SCR) devices. The trigger voltage of LVTSCR in the submicron CMOS technology had been lowered to be about ten volts. The following works can be referenced.

[1] A. Chatterjee and T. Polgreen, "A low-voltage triggering SCR for on-chip ESD protection at output and input pads," Proc. Symp. On VLSI Tech., 1990, pp. 75–76.

[2] M. -D. Ker, C. -Y. Wu, and H. -H. Chang, "Complementary-LVTSCR ESD protection circuit for submicron CMOS VLSI/ULSI," IEEE Trans. Electron Devices, pp. 588–598, 1996.

[3] M. -D. Ker, H. -H. Chang and C. Y. Wu, "ESD protection for deep-submicron CMOS technology using gate-couple CMOS-trigger lateral SCR structure," Technical Digest of IEDM, 1995, pp. 543–546.

Referring to FIG. 1a, the device structure of a LVTSCR 10 is illustrated. The LVTSCR 10 has an anode 10a, a control gate 10b, and a cathode 10c. As an example, the anode 10a connects to a pad and the control gate 10b and the cathode 10c connect commonly to ground for ESD protection. The I-V characteristics of the LVTSCR 10 are shown in FIG. 1b. The LVTSCR 10 can sustain high ESD voltage with only occupying a much smaller layout area than conventional ESD protection circuits by it's low holding voltage. To avoid the unexpected ESD damages on the internal circuits beyond the input or output ESD protection circuits, an effective ESD clamp circuit has to be placed between the VDD and VSS power lines of an IC to provide the whole-chip ESD protection. The following references discuss the ESD damages and the ESD clamp circuit.

[4] C. Duvvury, R. N. Rountree, and O. Adams, "Internal chip ESD phenomena beyond the protection circuit," IEEE Trans. On Electron Devices, pp. 2133–2139, 1988.

[5] C. Johnson, et al., "Two unusual HBM ESD failure mechanisms on a mature CMOS process," Proc. EOS/ESD Symp., 1993, pp. 225–231.

[6] H. Terletzki, et al., "Influence of the series resistance of on-chip power supply buses on internal device failure after ESD stress," IEEE Trans. Electron Devices, pp. 2081–2083, 1993.

[7] M. Chaine, S. Smith, and A. Bui, "Unique ESD failure mechanisms during negative to Vcc HBM tests," Proc. EOS/ESD Symp., 1997, pp. 346–355.

[8] R. Merrill and E. Issaq, "ESD design methodology," Proc. EOS/ESD Symp., 1993, pp. 233–237.

[9] E. Worley, et al., "Sub-micron chip ESD protection schemes which avoid avalanching junctions," Proc. EOS/ESD Symp., 1995, pp. 13–20.

[10] M. -D. Ker and S. -C. Liu, "Whole-chip ESD protection design for submicron CMOS VLSI," Proc. IEEE ISCAS, 1997, pp. 1920–1923.

Thus the area-efficient lateral SCR devices had been used in the VDD-to-VSS clamp circuits to effectively bypass the ESD current away from the internal circuits. The following works can be referenced.

[11] G. D. Corft, "ESD protection using a variable voltage supply clamp," Proc. EOS/ESD Symp., 1994, pp. 135–140.

[12] J. T. Watt and A. J. Walker, "A hot-carrier triggered SCR for smart power bus ESD protection," Tech. Digest of IEDM, 1995, pp.341–344.

The LVTSCR in the ESD protection circuit is easily triggered on by the external noise pulses with the low trigger voltage and current. Thus the LVTSCR can be easily triggered on even at normal operation conditions. Since the holding voltage of the LVTSCR is only around one volt, the LVTSCR might be triggered on by the external pulses and latched the input or output signals. The input or output signals can be destroyed and kept from reaching the operational devices of the internal circuit. Referring to FIG. 2a, a schematic diagram illustrating the noise pulse Z1 at an input pad 12 to trigger on the LVTSCR 10 is shown. FIG. 2b illustrates a schematic diagram showing the noise pulse Z2 at an output pad 16 to trigger on the LVTSCR 10. The normal input/output signals are thus latched by the LVTSCR 10 to cause the failure or the malfunction in the system applications.

In the test of authorizing the "CE" mark from the European Community, an ESD gun with the ESD voltage of 8 KV to 15 KV is used to test the electromagnetic compatibility (EMC) of the electronic products. The related references are as follows.

[13] Electromagnetic compatibility for industrial-process measurement and control equipment, International Standard IEC 801–2, 1991.

[14] J. Maas and D. Skjeie, "Testing electronic products for susceptibility to electrostatic discharge," Proc. of EOS/ESD Symp., 1990, pp. 92–96.

[15] W. T. Rhoades, "ESD stress on IC's in equipment," Proc. EOS/ESD Symp., 1990, pp. 82–91.

During the system-level ESD/EMC testing, the power lines of the IC's in the system board can be coupled with an overstress voltage even up to several hundreds volts. The system-level ESD/EMC test is illustrated in FIG. 3a. The typical ESD-coupled transient voltage on the VDD pin of an IC in the system board is illustrated in FIG. 3b. Such a system-level ESD/EMC event easily causes the transient-induced latchup failure in the CMOS IC's. The topics are discussed in the following references.

[16] E. Chwastek, "A new method for assessing the susceptibility of CMOS integrated circuits to latch-up: the system-transient technique," Proc. EOS/ESD Symp., 1989, pp. 149–155.

[17] G. Weiss and D. Young, "Transient-induced latchup testing of CMOS integrated circuits," Proc. EOS/ESD Symp., 1995, pp. 194–198.

If the lateral SCR or the LVTSCR are used as the ESD clamp devices between the VDD and VSS power lines of an IC [11]–[12], such ESD-protection SCR devices are easily triggered on by the system-level ESD/EMC transient pulses to cause very serious latchup problem in the CMOS IC's.

Although the LVTSCR can provide very effective ESD-protection capability within a much small layout area, the LVTSCR still can not be safely used in the input and output ESD protection circuits or the VDD-to-VSS ESD clamp circuits. The latchup problem in destroying operational signals from the low holding voltage of the conventional LVTSCR devices must be solved. The ESD protection of the integrated circuits fulfilling future specification of small area and high bypassing current is in highly demand.

SUMMARY OF THE INVENTION

The present invention provides a cascode LVTSCR (low-voltage triggering silicon controlled rectifier) with tunable holding voltage. The cascode LVTSCR can be used in ESD protection circuit with high bypassing ability without latchup risk. The cascode LVTSCR can provide the CMOS IC with effective ESD protection but without accidental triggering on by the overshooting or undershooting noise pulses in the system applications.

The cascode LVTSCR includes two or more SCRs (silicon controlled rectifiers). Each SCR has an anode, a control gate, and a cathode. The SCRs are cascoded in series by coupling the control gates of same type SCRs in common and coupling the cathode of one SCR to the anode of next SCR in series.

The electrostatic discharge (ESD) protection circuit in the present invention includes a cascode LVTSCR (low-voltage triggering silicon controlled rectifier) with an anode and a cathode coupled between power supplies of the ICs, and a detecting circuit coupled between the power supplies of the ICs for detecting an electrostatic charge to trigger the control gates of the cascode LVTSCR for dissipating the electrostatic discharge.

For applications in the ESD protection of the input/output pads, another electrostatic discharge protection circuit can be employed. The electrostatic discharge protection circuit includes a first cascode LVTSCR, a second cascode LVTSCR, a first detecting circuit, and a second detecting circuit. The first cascode LVTSCR for protecting an internal circuit from an electrostatic discharge coming from the input/output pad has an anode and a cathode coupled between a first voltage source and the input/output pad. The second cascode LVTSCR for protecting an internal circuit from the electrostatic discharge coming from the input/output pad has an anode and a cathode coupled between the input/output pad and a second voltage source. The first detecting circuit is coupled between the first voltage source and the input/output pad to detect the electrostatic charge to trigger control gates of the first cascode LVTSCR to dissipate the electrostatic discharge. The second detecting circuit is coupled between the second voltage source and the input/output pad for detecting the electrostatic charge to trigger control gates of the second cascode LVTSCR to dissipate the electrostatic discharge.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

The present invention disclosed a SCR (silicon controlled rectifier) device with raised holding voltage and unchanged low trigger voltage. A cascode LVTSCR (low-voltage triggering silicon controlled rectifier) is provided by a cascode structure of LVTSCRs. The cascode LVTSCR with higher holding voltage and strong bypassing current can be utilized in various applications. Several kinds of electrostatic discharge (ESD) protection circuits employing the cascode LVTSCR are also disclosed in detail. The ESD protection circuit can be applied to protecting undesired ESD from pad connections of the integrated circuits. The internal circuits can be protected from ESD safely without being damaged in the operation and the functionality. ESD from the power supplies and the input/output pads can be dissipated by the proposed cascode LVTSCR between the VDD, VSS, and input/output pads. ESD detecting means or ESD detecting circuits are employed to trigger on the cascode LVTSCR to dissipate discharges. The structure of the cascode LVTSCR is disclosed to provide a SCR device with tunable characteristics. The latchup problem in destroying operational signals from the low holding voltage of the conventional LVTSCR devices can be solved. An ESD protection of the integrated circuit fulfilling future specification of small area and high bypassing current but without latchup danger is achieved.

Figure 1A:
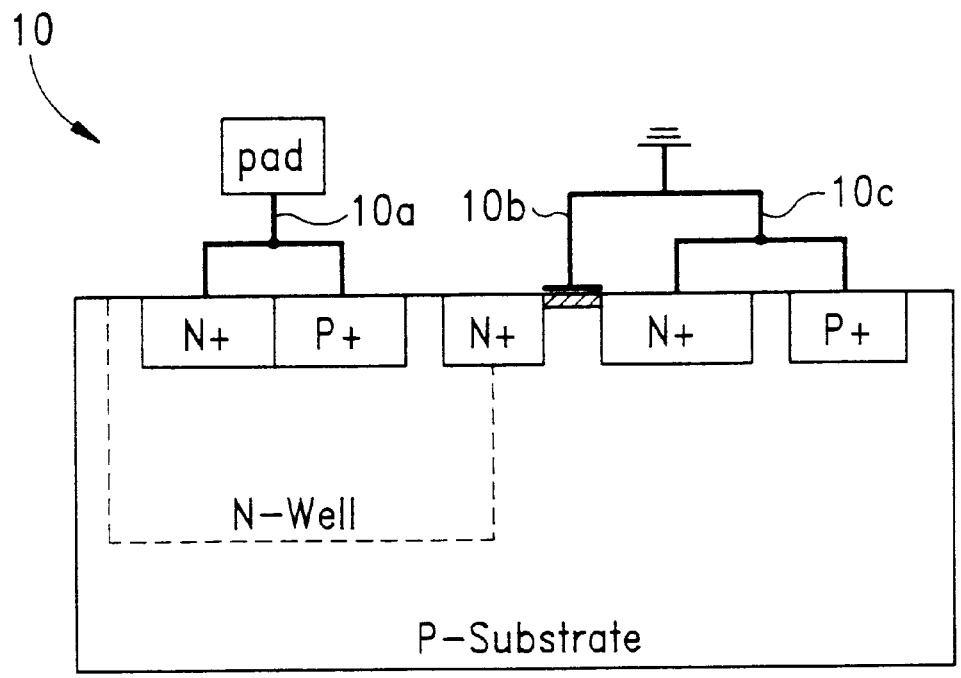
FIG. 1a is the cross section of a conventional LVTSCR device in the prior art.
Figure 1B:
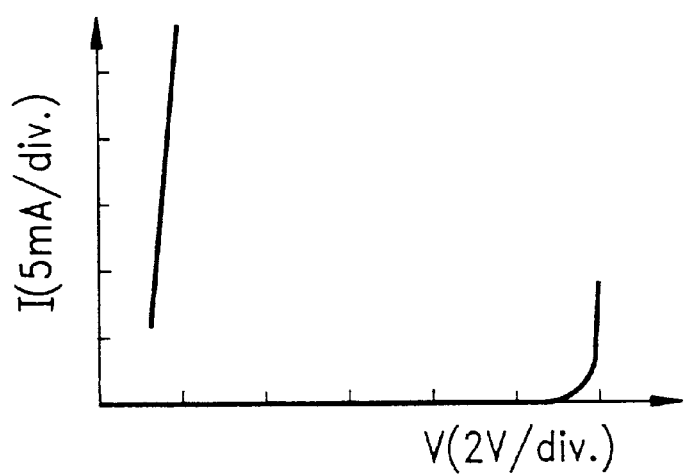
FIG. 1b illustrates the I-V curve of a conventional LVTSCR device in the prior art.
Figure 2A:
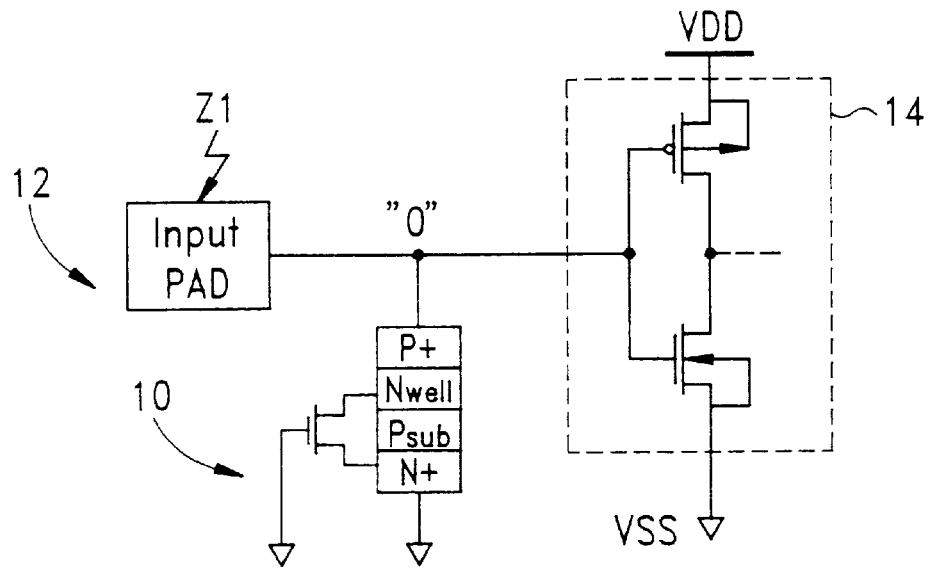
FIG. 2a is a schematic diagram of the triggering of the LVTSCR device in the input ESD protection circuit by a noise pulse in the prior art.
Figure 2B:
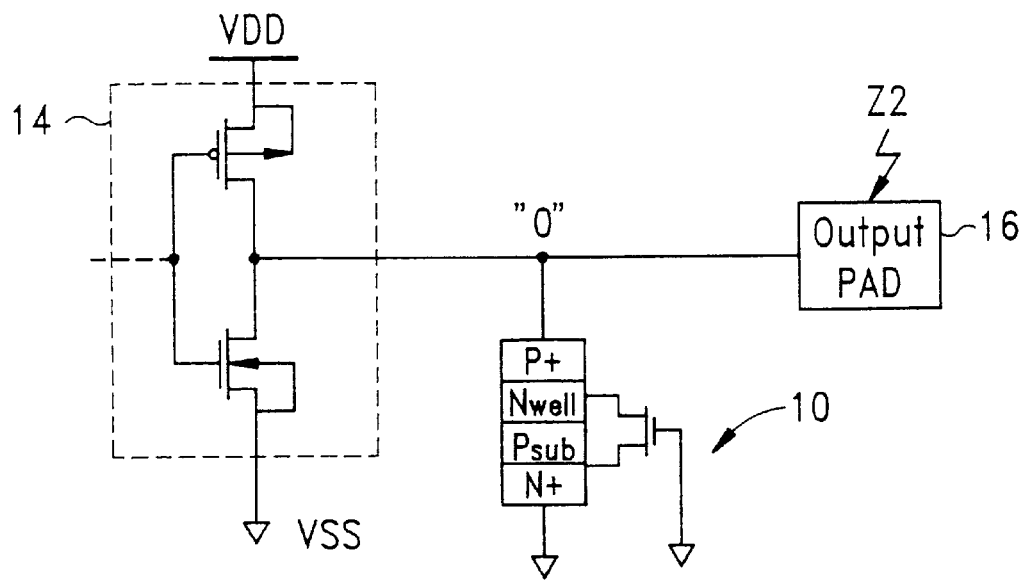
FIG. 2b is a schematic diagram of the triggering of the LVTSCR device in the output ESD protection circuit by a noise pulse in the prior art.
Figure 3A:
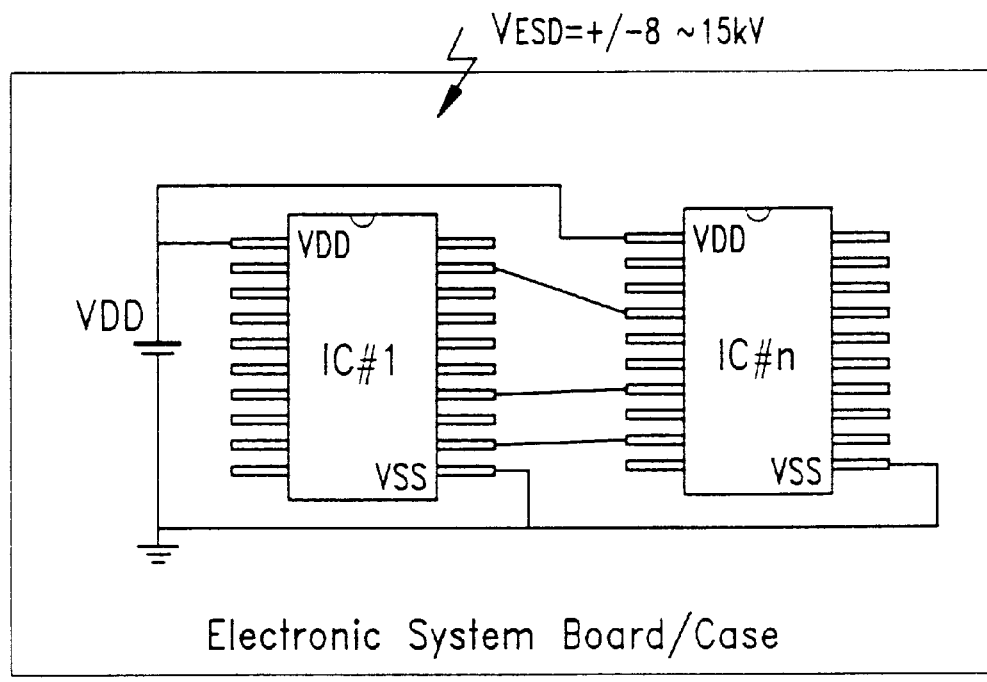
FIG. 3a is a schematic diagram of the system-level ESD/EMC test.
Figure 3B:
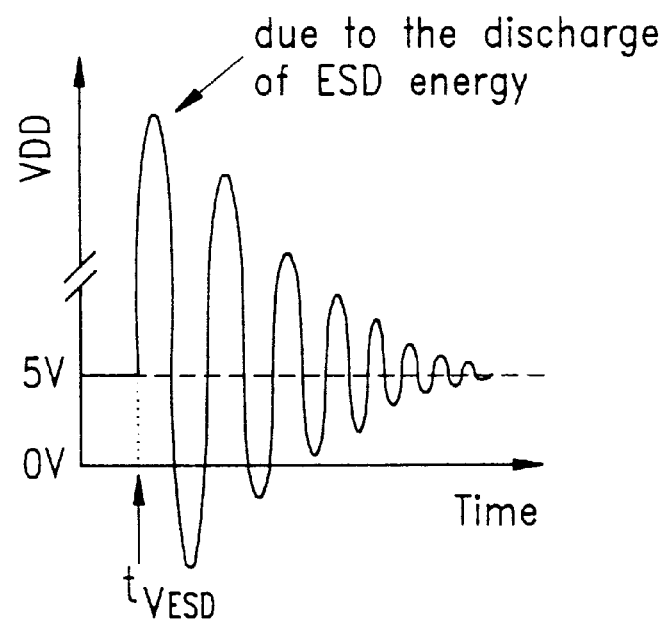
FIG. 3b is a schematic waveform of the ESD coupled transient voltage on the VDD pin of the IC in the system board during the system-level ESD/EMC testing.
Figure 4:
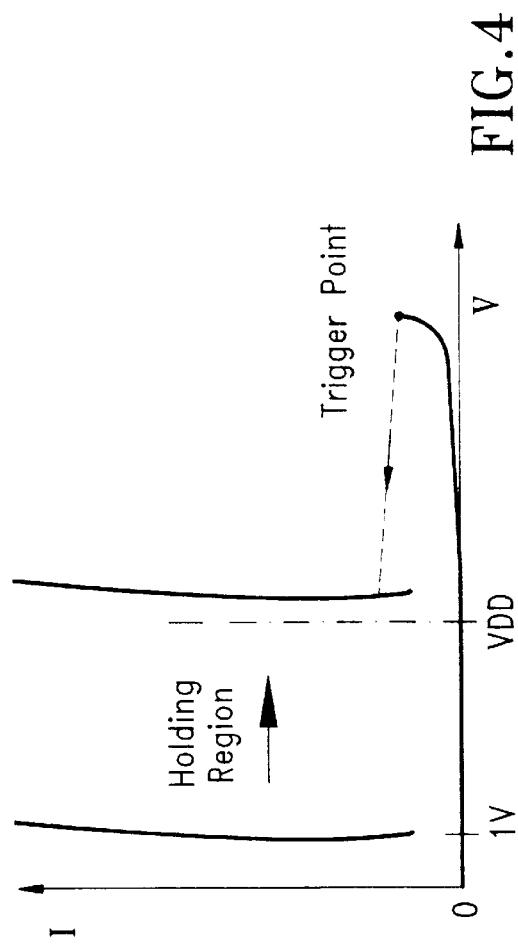
FIG. 4 is the schematic I-V characteristics of an LVTSCR device with an increased holding voltage to overcome the VDD-to-VSS latchup problem in the present invention.

As disclosed in the background of the invention, conventional LVTSCR devices subject to the latchup problem under the low holding voltage. To avoid the accidental trigger-on and the VDD-to-VSS latchup problem, the holding voltage of the LVTSCR has to be greater than VDD of the IC (integrated circuits). A method of using double guard rings to surround both the anode and the cathode of a LVTSCR device can increase the holding voltage. The guarding structure can break the latching path and increase the holding voltage. The schematic I-V characteristics of the LVTSCR with an increased holding voltage is illustrated in FIG. 4. However, increasing the holding voltage of an LVTSCR leads to more power dissipation located on the LVTSCR during the ESD transition. This method by using the double guard rings causes a lower ESD robustness of the LVTSCR. Moreover, the latchup guard rings generally occupied wider layout spacing. Thus more layout area are needed to increase the holding voltage of an LVTSCR greater than VDD in the bulk CMOS process.

Figure 5A:
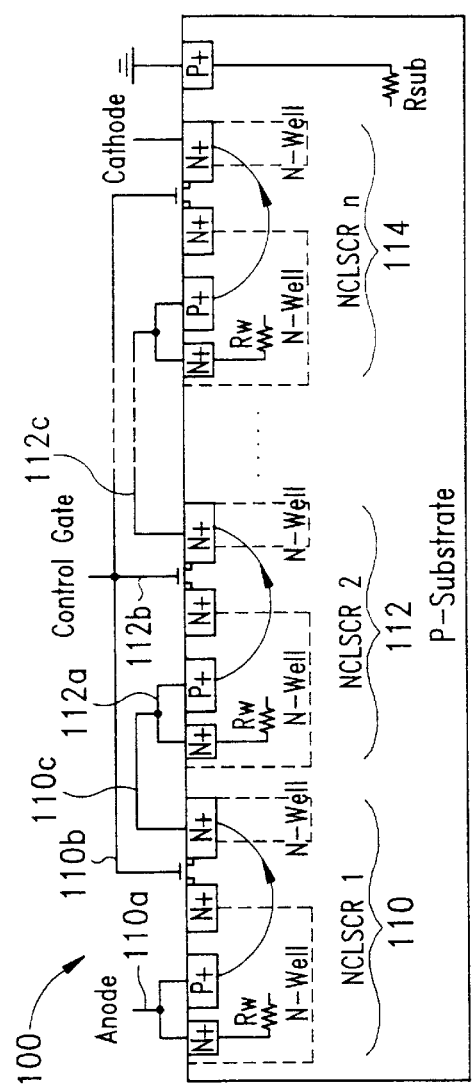
FIG. 5a is the cross section of a cascode LVTSCR with cascoding NCLSCRs in the present invention.
Figure 5B:
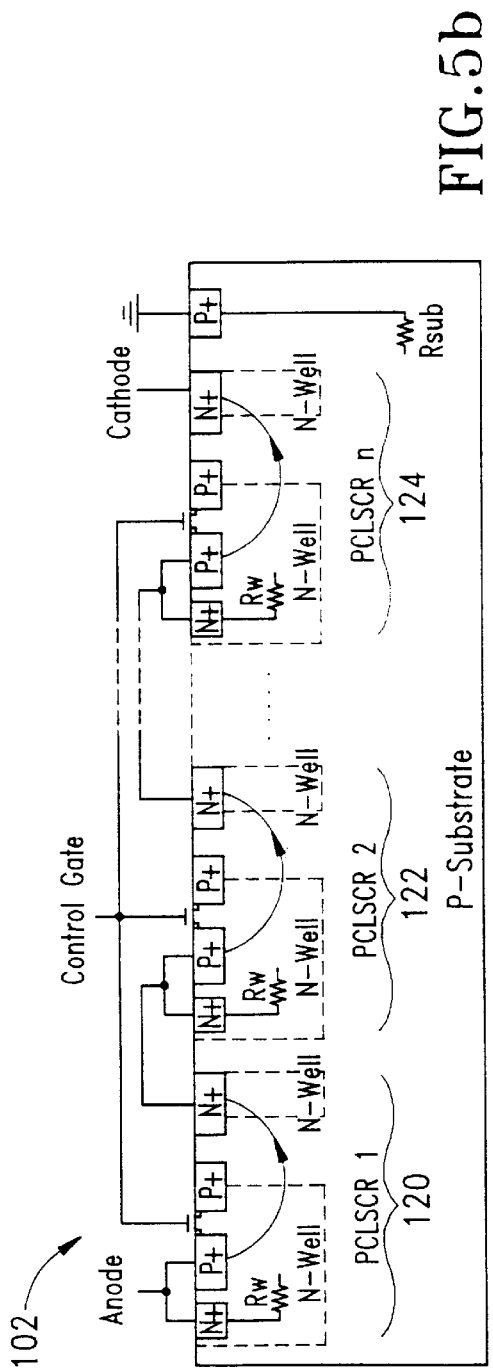
FIG. 5b is the cross section of a cascode LVTSCR with cascoding PCLSCRs in the present invention.
Figure 5C:
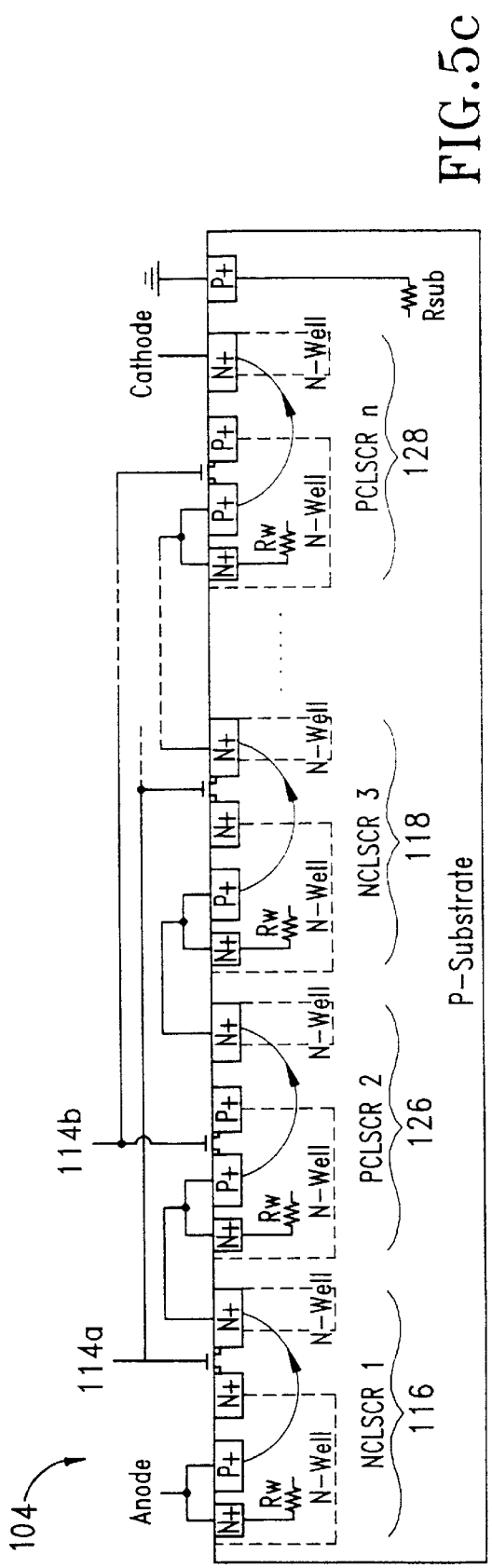
FIG. 5c is the cross section of a cascode LVTSCR with a mixed cascoding of NCLSCRs and PCLSCRs in the present invention.

A cascode configuration of LVTSCR is disclosed in the present invention. Referring to FIG. 5a, the device structure of the proposed cascode LVTSCR 100 utilizing NCLSCRs (NMOS-controlled lateral SCRs) 110, 112, and 114 is shown. The cascode LVTSCR 100 can include two or more NCLSCRs. The first NCLSCR 110 has a first anode 110a, a first control gate 110b, and a first cathode 110c. Similarly the second NCLSCR 112 having a second anode 112a, a second control gate 112b, and a second cathode 112c. The second NCLSCR 112 is cascoded with the first NCLSCR 110 by coupling the second anode 112a with the first cathode 110c and by coupling the first control gate 110b and the second control gate 112b to act as a control gate for the cascode LVTSCR 100. The first anode 110a then acts as an anode for the cascode LVTSCR 100 and the second cathode 112c acts as a cathode for the cascode LVTSCR. Furthermore, additional one or more NCLSCR 114 can be cascoded in series with the same coupling way. Besides, PCLSCRs (PMOS-controlled lateral SCRs)120, 122, and 124 can be used alternatively to replace NCLSCRs 110, 112, and 114 with the same cascode coupling to form another cascode LVTSCR 102, as shown in FIG. 5b. A cascode LVTSCR 104 mixing cascoding NCLSCRs 116 and 118, and PCLSCRs 126 and 128 can also formed in the same way by having two independent control gate of N-control gate 114a and P-control gate 114b, as shown in FIG. 5c.

By using the cascode configuration, the total voltage drop across the cascode LVTSCR 100 in FIG. 5a is raised to the sum of the voltage drop across every NCLSCR including 110, 112, and 114. Therefore, the holding voltage of the cascode LVTSCR 100, 102, or 104 become tunable by changing the number of the NCLSCRs or PCLSCRs in the cascode configuration. For example, if the cascode LVTSCR includes six NCLSCR devices with a holding voltage of about one volt, the total holding voltage can be raised to be greater than a VDD of five volts. The trigger voltage of the cascode LVTSCR can be kept unchanged with the common control gate configuration. Since each NCLSCR device still has a holding voltage of about one volt, the ESD power dissipation located on each NCLSCR device in the cascode LVTSCR is the same. The ESD robustness of the cascode LVTSCR with a raised holding voltage can be still maintained at a high level as that of the conventional LVTSCR. The holding voltage can be increased without increasing the power dissipation. Thus the cascode LVTSCR can safely apply the advantage of the LVTSCR for whole-chip ESD protection without causing the accidental trigger-on or the latchup problem in the CMOS IC's. The ESD protection robustness is raised and the latchup problem during the system-level ESD/EMC testing is eliminated.

Figure 6:
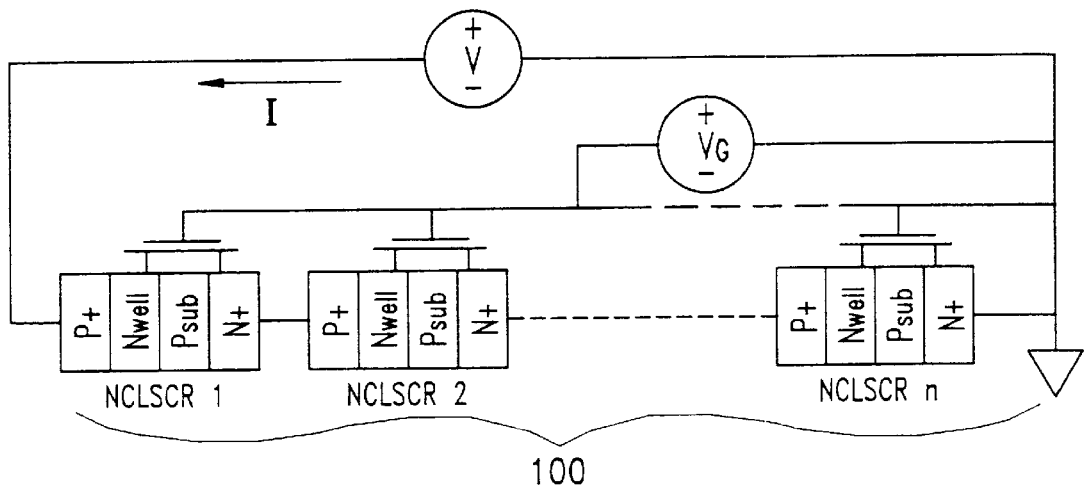
FIG. 6 is a schematic diagram of the setup to measure the I-V characteristics of the cascode LVTSCR.
Figure 7:
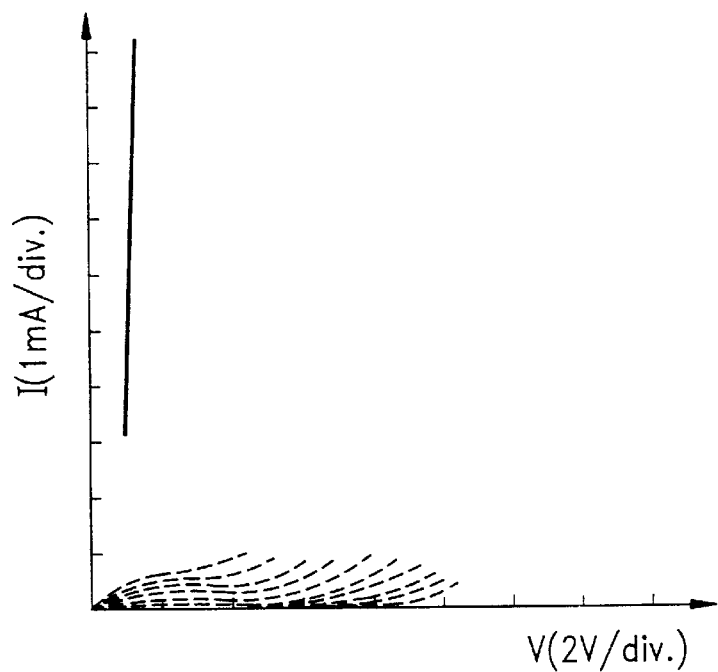
FIG. 7 illustrates the I-V curve of a single NCLSCR device with different gate biases.

A cascode LVTSCR with aforementioned structure is manufactured and tested. The setup to measure the I-V characteristics of the cascode LVTSCR 100 is shown in FIG. 6. The I-V curves of a single NCLSCR is shown in FIG. 7 with different gate biases. The trigger of the NCLSCR is significantly reduced as its gate voltage is increased. The holding voltage of a single NCLSCR is as low as 0.99 volt. The value is much lower than the VDD of CMOS IC's. Such an NCLSCR in the ESD protection circuit is easily triggered on during the system-level ESD/EMC test or the high-temperature high-voltage reliability test to cause failures or malfunctions in the application systems.

Figure 8A:
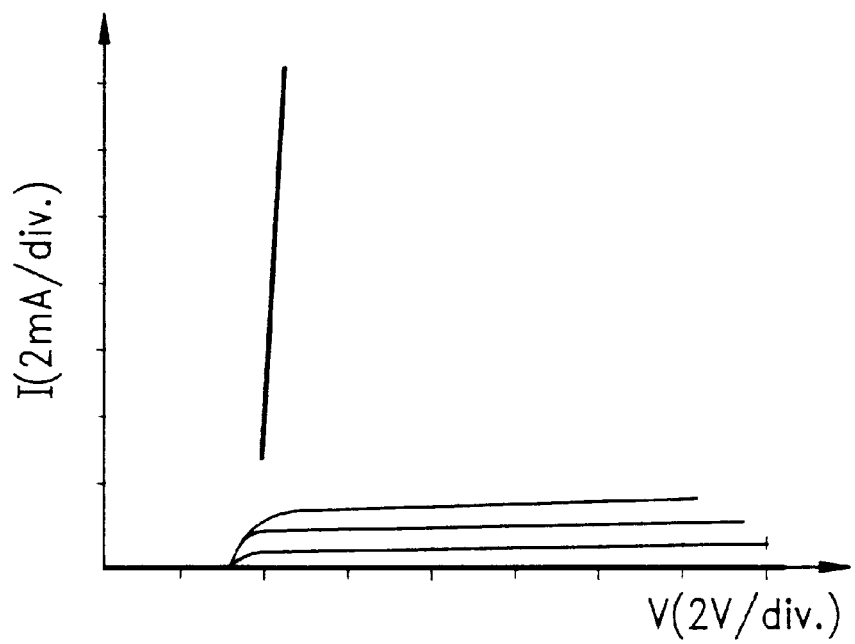
FIG. 8a illustrates the I-V curve of the cascode LVTSCR with four NCLSCRs under different gate biases in the present invention.
Figure 8B:
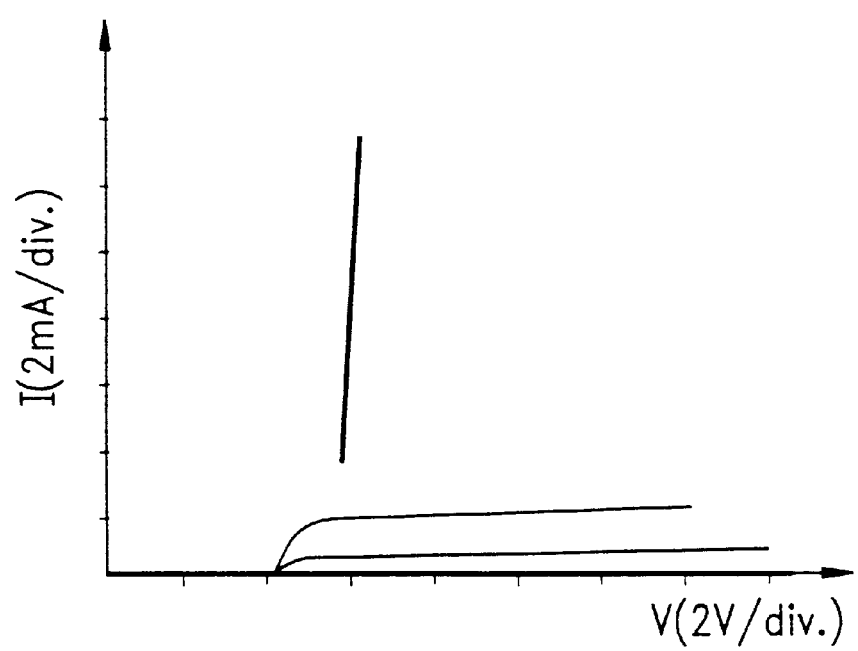
FIG. 8b illustrates the I-V curve of the cascode LVTSCR with six NCLSCRs under different gate biases in the present invention.
Figure 9:
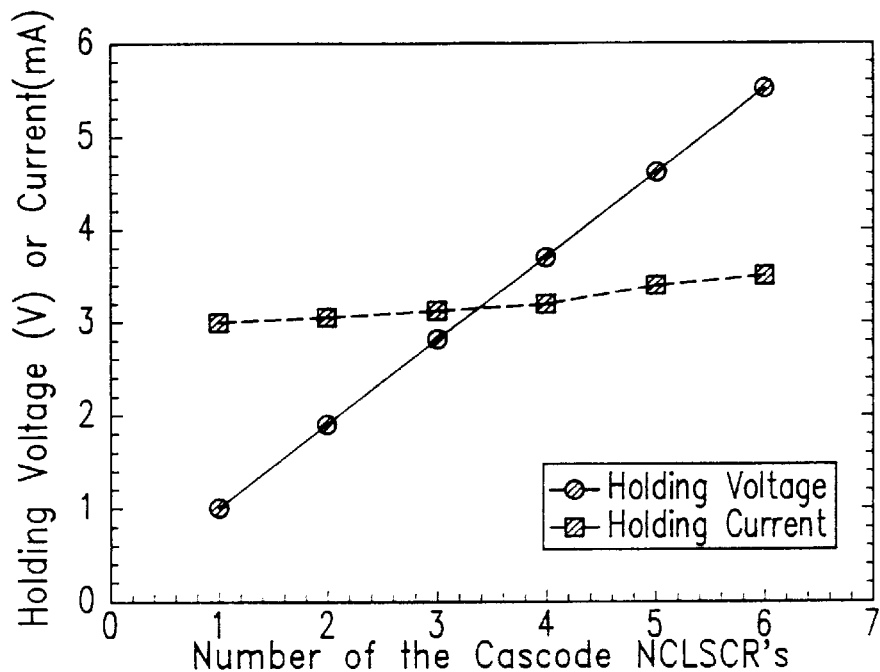
FIG. 9 illustrates the dependence of the holding voltage and the holding current of the cascode LVTSCR on the number of NCLSCRs in the present invention.

The I-V curves of a cascode LVTSCR with four NCLSCRs under different biases are shown in FIG. 8a. The I-V curves of a cascode LVTSCR with six NCLSCRs under different biases are shown in FIG. 8b. With a positive gate voltage, the cascode LVTSCR is easily triggered into the holding region. The holding voltage of the four cascode NCLSCRs is 3.82 volts, whereas the holding voltage of the six cascode NCLSCRs is 5.52 volts. The dependence of the holding voltage and holding current of the cascode LVTSCR on the number of the NCLSCR devices is shown in FIG. 9. The holding current of the cascode LVTSCR is only slightly increased as the number of the cascode NCLSCRs is increased. But the holding voltage of the cascode LVTSCR becomes tunable to meet the different applications. For example, six NCLSCRs can be applied for the five volts CMOS IC's and four NCLSCRs can be applied for the three volts CMOS IC's to safely apply the cascode NCLSCRs for ESD protection with respectively holding voltage of 5.52 volts and 3.82 volts. The accidental trigger-on and the latchup problem in the CMOS IC's can be eliminated. The cascode LVTSCR in the present invention provides a practical and useful solution to safely apply the LVTSCR for effective on-chip ESD protection.

The cascode LVTSCR utilizing PCLSCRs has the similar device I-V characteristics to that utilizing PCLSCRs. The test results is not illustrated in detail. The characteristics of increasing holding voltage with increased number of PCLSCRs is the same.

Figure 10A:
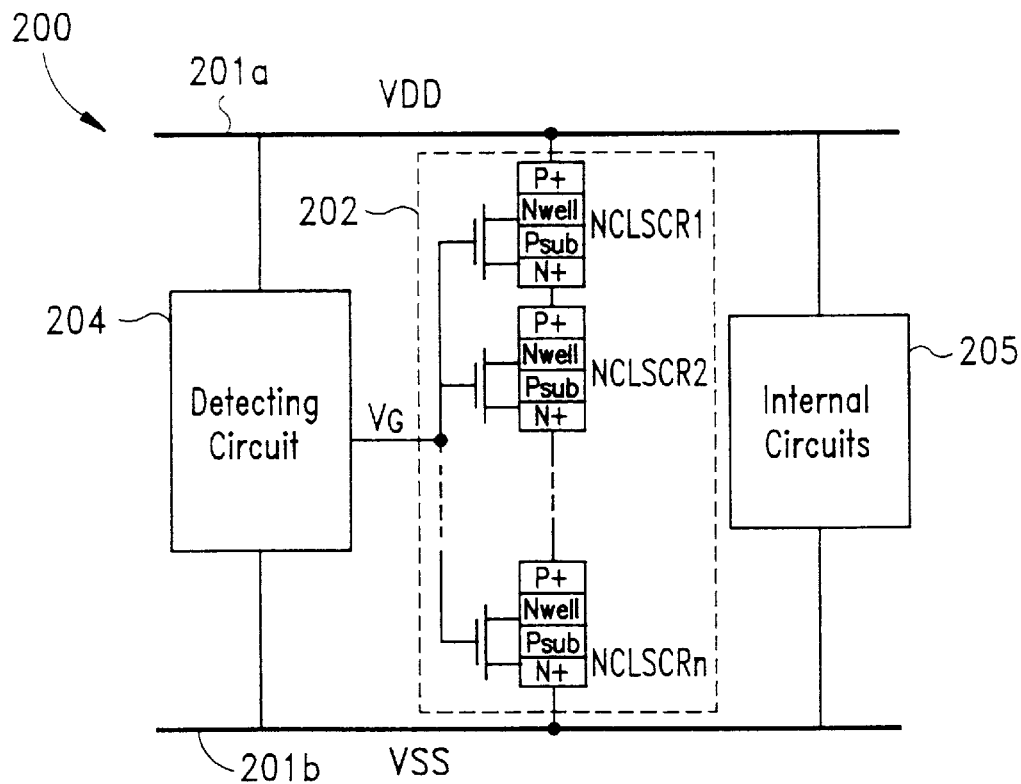
FIG. 10a illustrates an ESD protection circuit clamping to the power supplies with a detecting circuit and a cascode LVTSCR with NCLSCRs in the present invention.

With the aforementioned improved cascode LVTSCR with high holding voltage and low power dissipation, an electrostatic discharge (ESD) protection circuit clamping to the power supplies channels can be implemented. Referring to FIG. 10a, the ESD protection circuit 200 includes a protecting means 202 and a detecting means 204. The power supplies generally includes at least two voltage sources of VDD 201a and VSS 201b. VDD can be a voltage source like five volts and VSS can be a ground. The protecting means 202 can be implemented by a cascode LVTSCR which includes the cascoding NCLSCRs as shown in the figure. The cascode LVTSCR 202 in the example is coupled with the power supplies by connecting an anode and a cathode between VDD 201a and VSS 201b. The detecting means 204 can be implemented with a detecting circuit which is coupled between the power supplies to detect ESD to trigger the operation of the cascode LVTSCR 202 through the gates. Thus the internal circuits 205 can be kept from ESD damages.

Figure 10B:
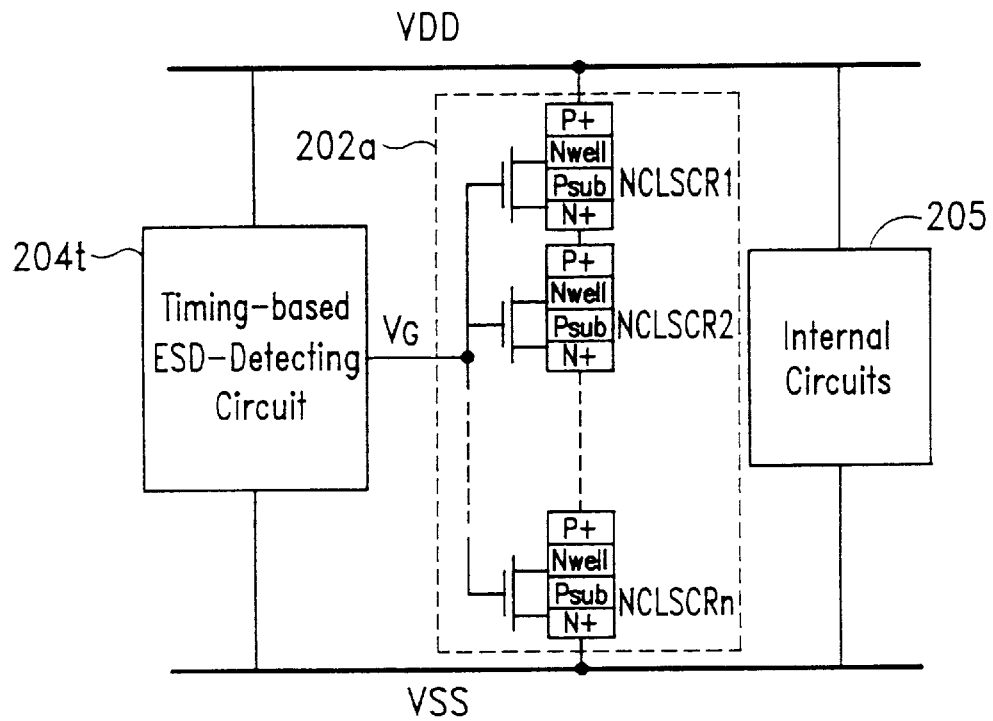
FIG. 10b illustrates an ESD protection circuit clamping to the power supplies with a timing-based ESD-detecting circuit in the present invention.
Figure 10C:
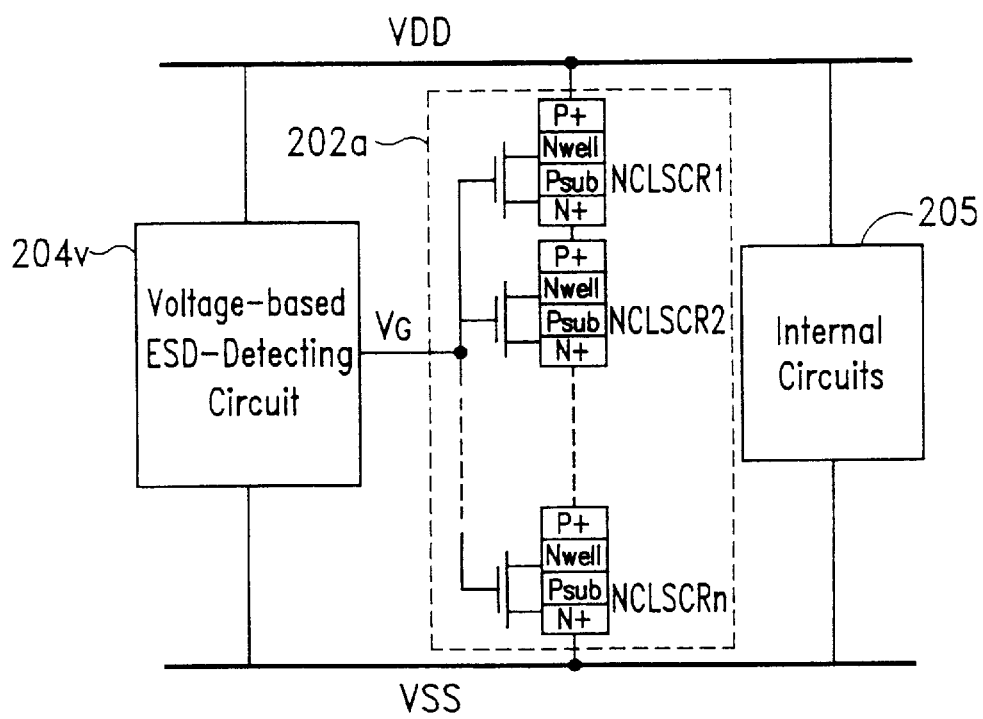
FIG. 10c illustrates an ESD protection circuit clamping to the power supplies with a voltage-based ESD-detecting circuit in the present invention.
Figure 11:
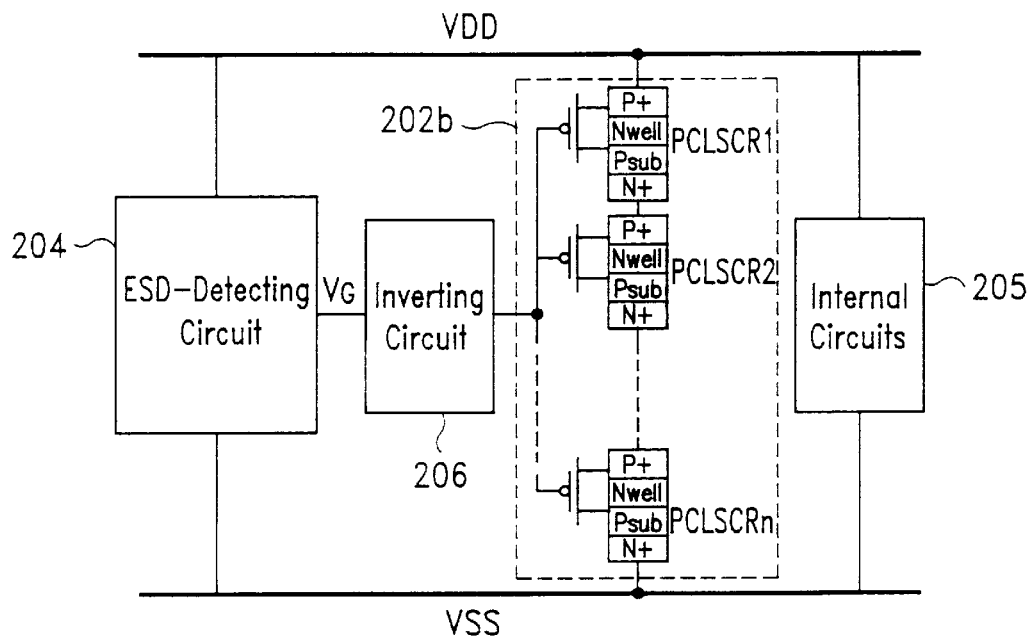
FIG. 11 illustrates an ESD protection circuit clamping to the power supplies with a cascode LVTSCR including PCLSCRs.
Figure 12:
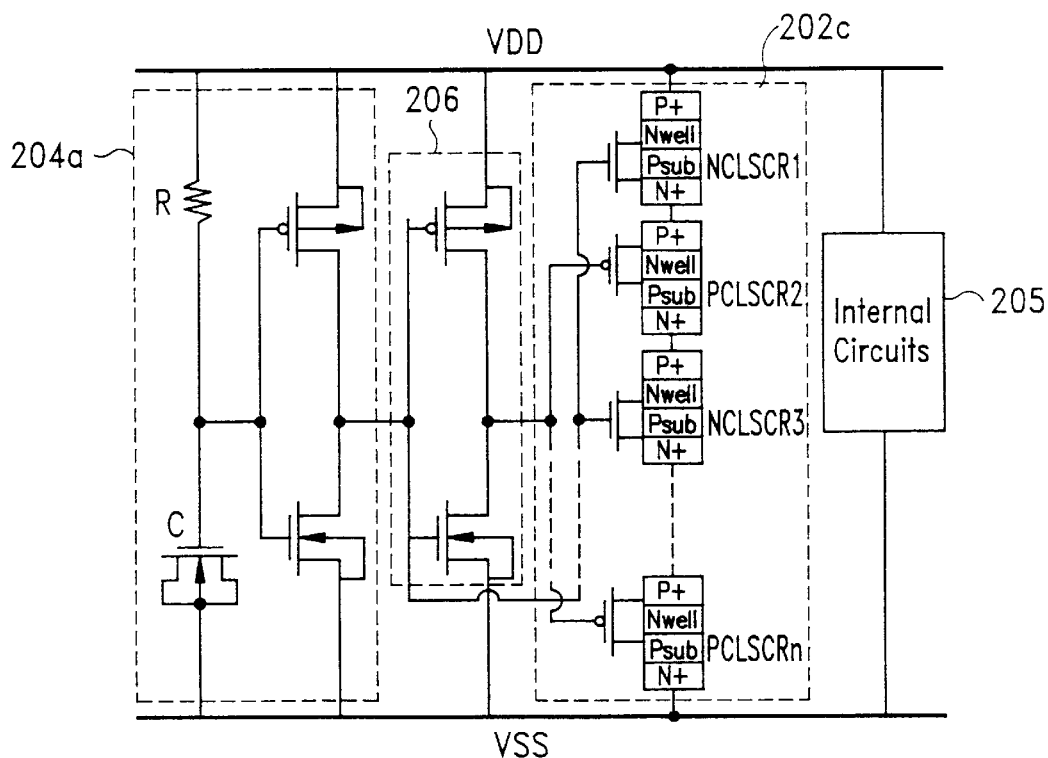
FIG. 12 illustrates an ESD protection circuit clamping to the power supplies with a cascode LVTSCR including the mixed NCLSCRs and PCLSCRs.

In general, the detecting means 204 can be implemented by a timing-based ESD-detecting circuit 204t in FIG. 10b or a voltage-based ESD-detecting circuit 204v in FIG. 10c. In addition, the protecting means can be implemented by a cascode LVTSCR 202b which includes the cascoding PCLSCRs as shown in FIG. 11. Since the triggering operation in the control gates of NCLSCRs and PCLSCRs are opposite to each other, inverting means or an inverting circuit 206 can be added to invert the triggering signal from the detecting circuit 204 to the control gate. The protecting means can also be implemented by a mixed cascode LVTSCR 202c which includes the cascoding NCLSCRs and PCLSCRs as shown in FIG. 12. The inverting circuit 206 is added for inverting the trigger signal to the control gates of PCLSCRs in the same way.

Figure 13A:
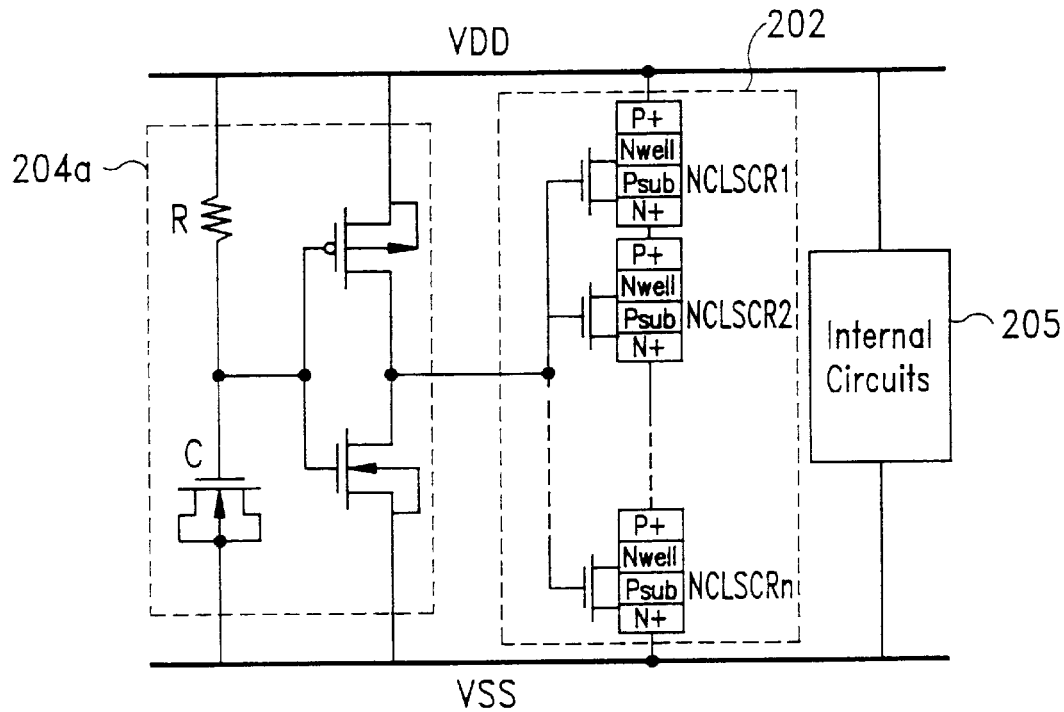
FIG. 13a illustrates an ESD protection circuit with a RC-delay circuit as the timing-based ESD-detecting circuit.
Figure 13B:
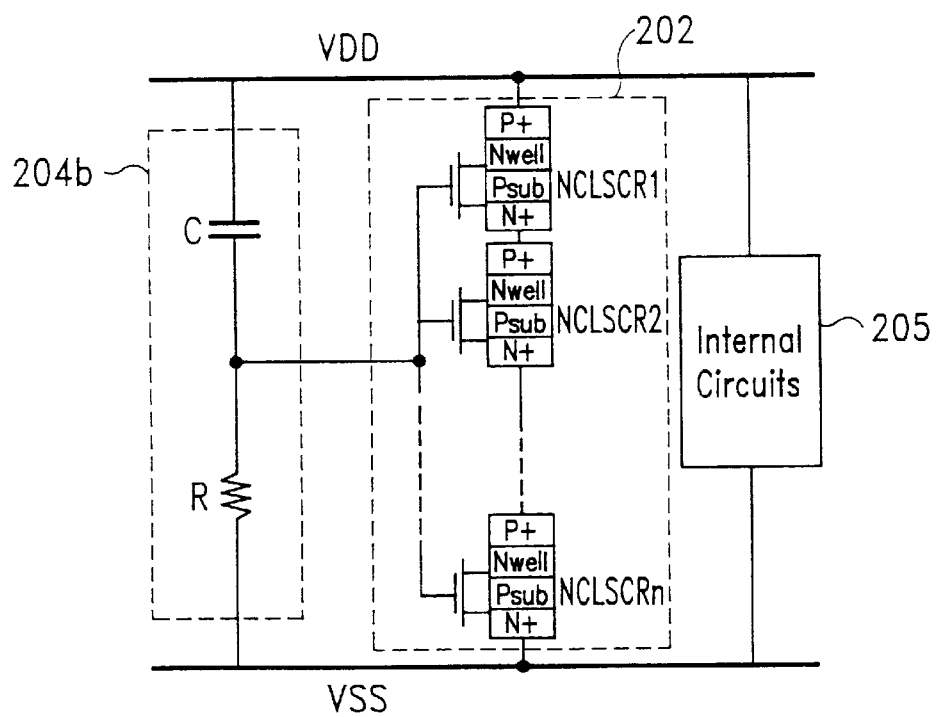
FIG. 13b illustrates an ESD protection circuit with a gate-coupled circuit as the timing-based ESD-detecting circuit.

Referring to FIG. 13a, a timing-based ESD-detecting circuit 204a including a RC-delay circuit is employed to control the turn-on of the cascode NCLSCRs. The timing-based ESD-detecting circuit can also be a gate-coupled circuit 204b to control the turn-on of the cascode NCLSCRs, as shown in FIG. 13b.

Figure 14A:
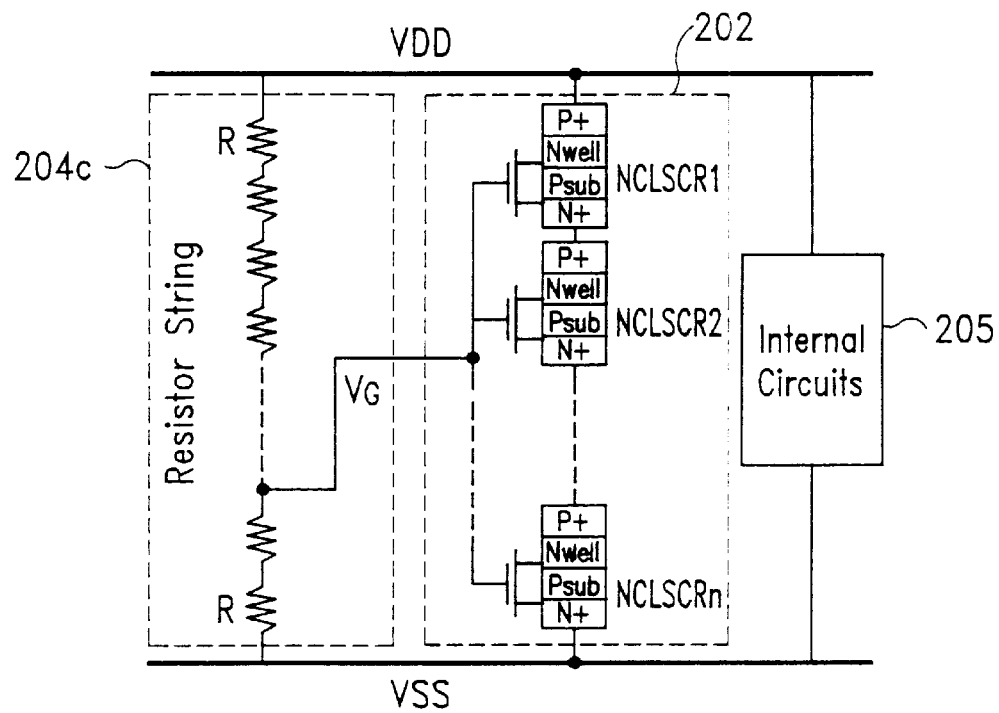
FIG. 14a illustrates an ESD protection circuit with a resistor string as the voltage-based ESD-detecting circuit.

The voltage-based ESD-detecting circuit is a circuit to realize a voltage division in order to control the gate voltage $V_G$ of the cascode NCLSCRs. Referring to FIG. 14a, a voltage-based ESD-detecting circuit 204c including a resistor string is employed to realize the voltage division. In the normal operating condition, the $V_G$ generated from the resistor string 204c between the VDD and VSS power lines is below the threshold voltage of the NMOS in the cascode LVTSCR 202. However, during the ESD stress conditions, the overstress voltage across the VDD and VSS power lines will generates a higher $V_G$ which is greater than the threshold voltage of the NMOS to turn on the cascoding NCLSCRs. Thus the overstress ESD voltage is clamped by the turned-on cascoding NCLSCRs.

Figure 14B:
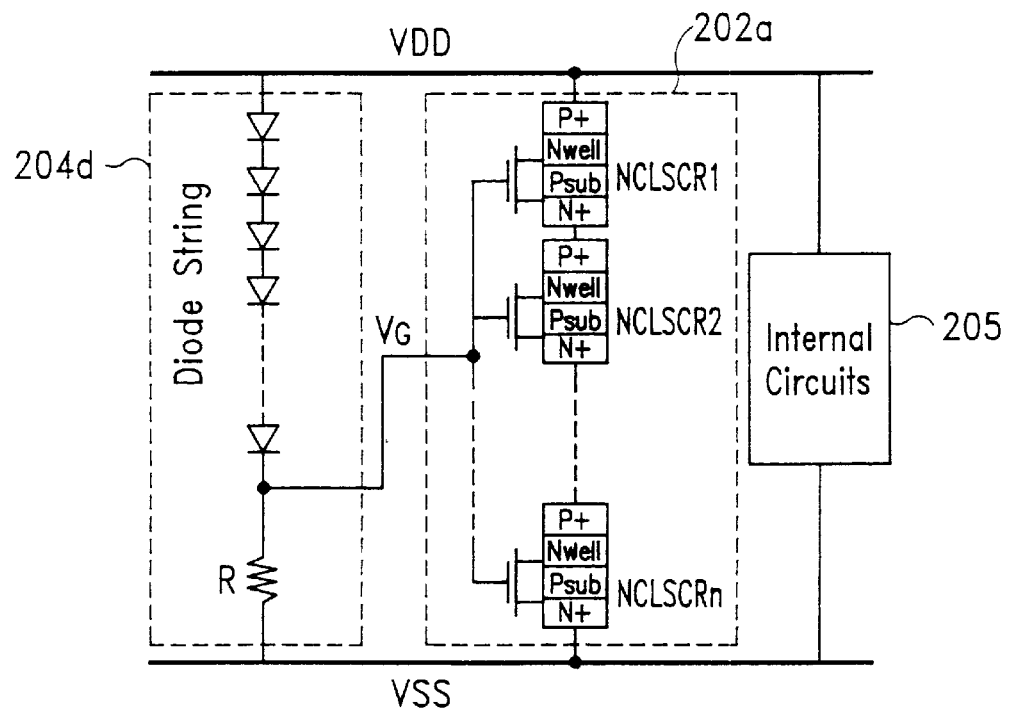
FIG. 14b illustrates an ESD protection circuit with a diode string as the voltage-based ESD-detecting circuit.
Figure 14C:
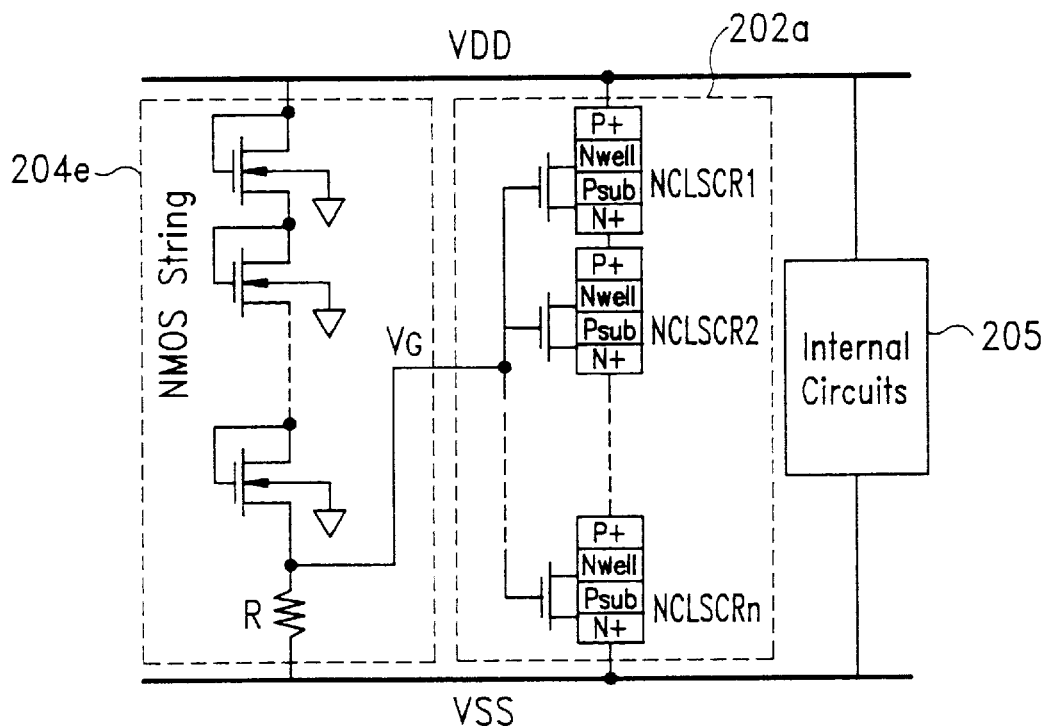
FIG. 14c illustrates an ESD protection circuit with a NMOS string as the voltage-based ESD-detecting circuit.
Figure 14D:
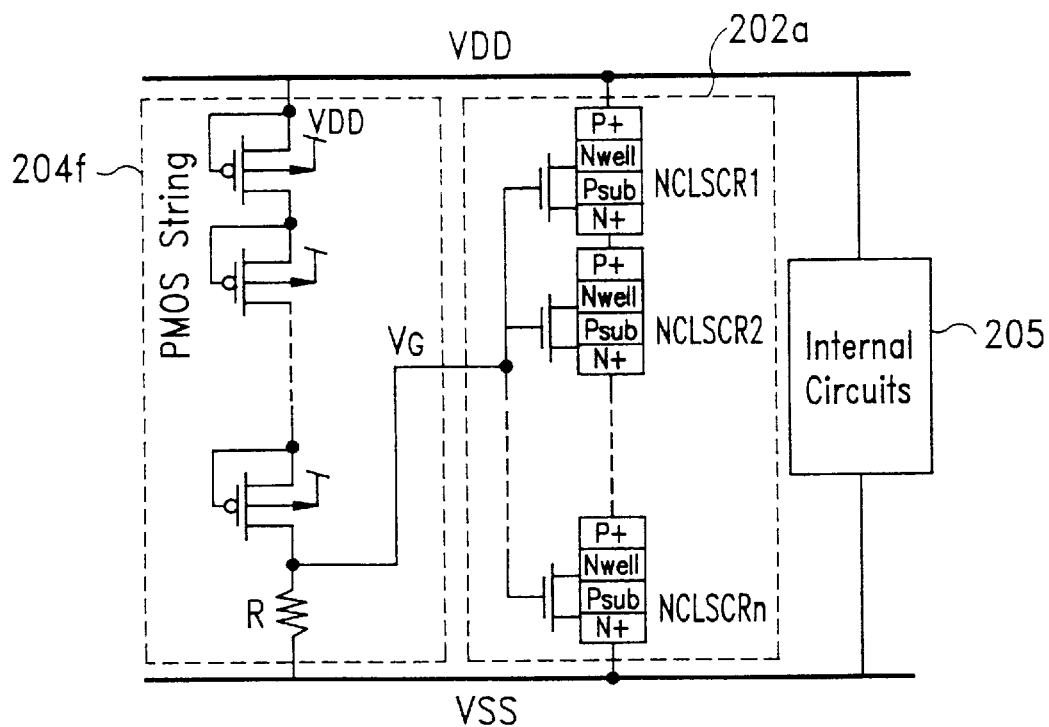
FIG. 14d illustrates an ESD protection circuit with a PMOS string as the voltage-based ESD-detecting circuit.
Figure 14E:
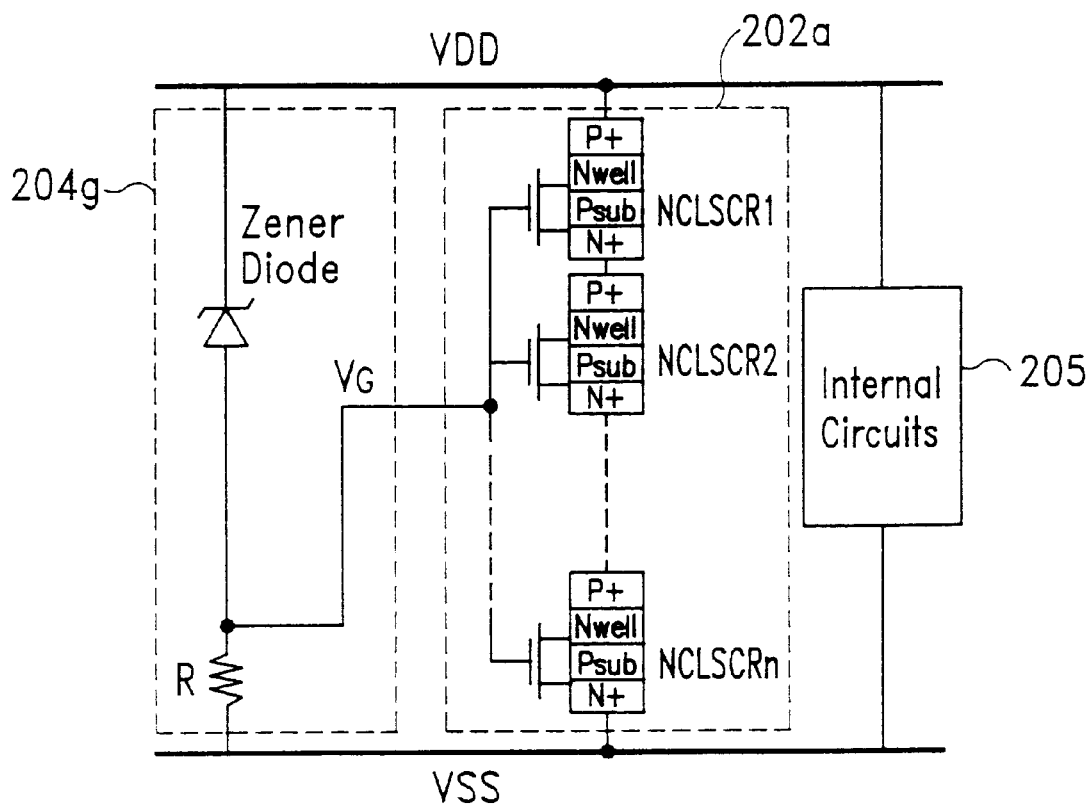
FIG. 14e illustrates an ESD protection circuit with a zener diode and a resistor as the voltage-based ESD-detecting circuit.

In FIG. 14b, a diode string 204b is used to reduce the voltage level on the $V_G$ when the IC is in the normal operating conditions. But during the ESD stress conditions, the overstress ESD voltage across the VDD and VSS power lines will rise up the $V_G$ voltage level and then to turn on the cascode NCLSCRs. Referring to FIG. 14c, the voltage-based ESD-detecting circuit can be implemented by active devices like a NMOS string 204e. Alternatively, the voltage-based ESD-detecting circuit can be implemented by a PMOS string 204f, as shown in FIG. 14d. Another way to realize a voltage division is to use a zener diode and a resistor which is shown as 204g in FIG. 14e. To control the breakdown voltage of the zener diode below the device breakdown voltage of the internal circuits, the $V_G$ will be risen up when the zener diode is breakdown by the overstress voltage across the VDD and VSS power lines. So, the cascode NCLSCRs can be turned-on by the risen-up $V_G$ to bypass the overstress voltage across the VDD and VSS power lines.

Figure 15A:
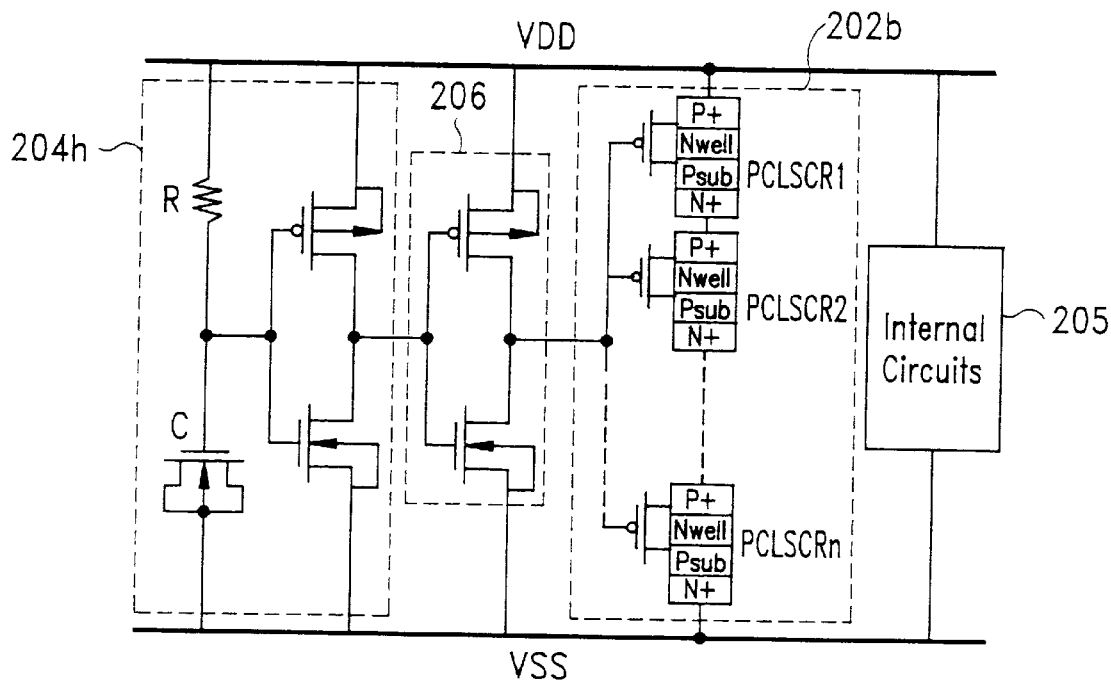
FIG. 15a illustrates an ESD protection circuit with a RC-delay circuit as the timing-based ESD-detecting circuit.
Figure 15B:
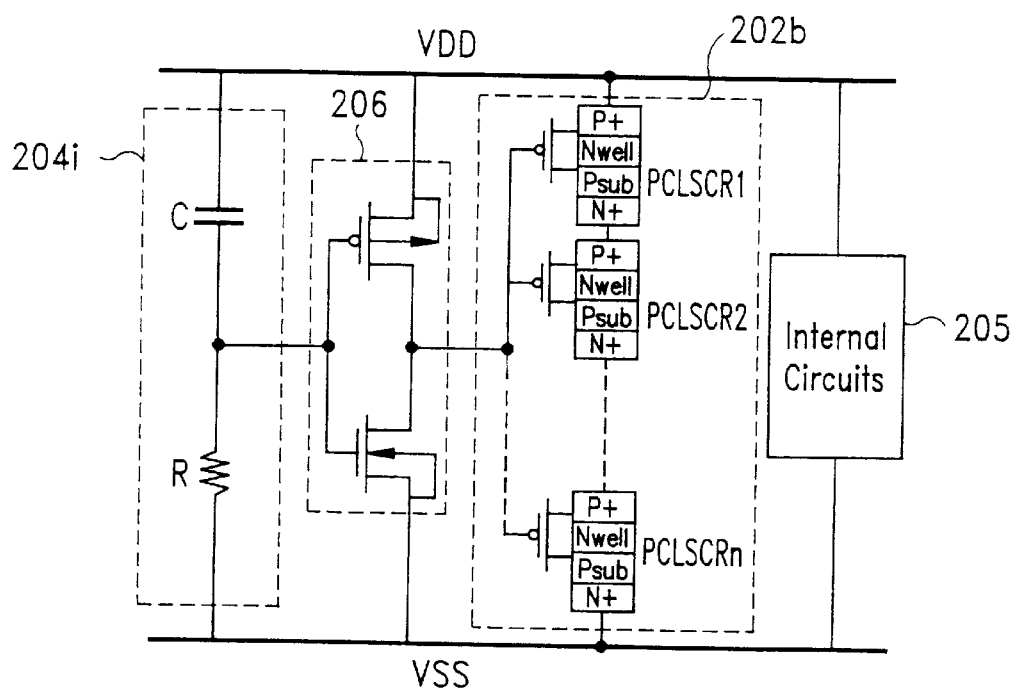
FIG. 15b illustrates an ESD protection circuit with a gate-coupled circuit as the timing-based ESD-detecting circuit.
Figure 16A:
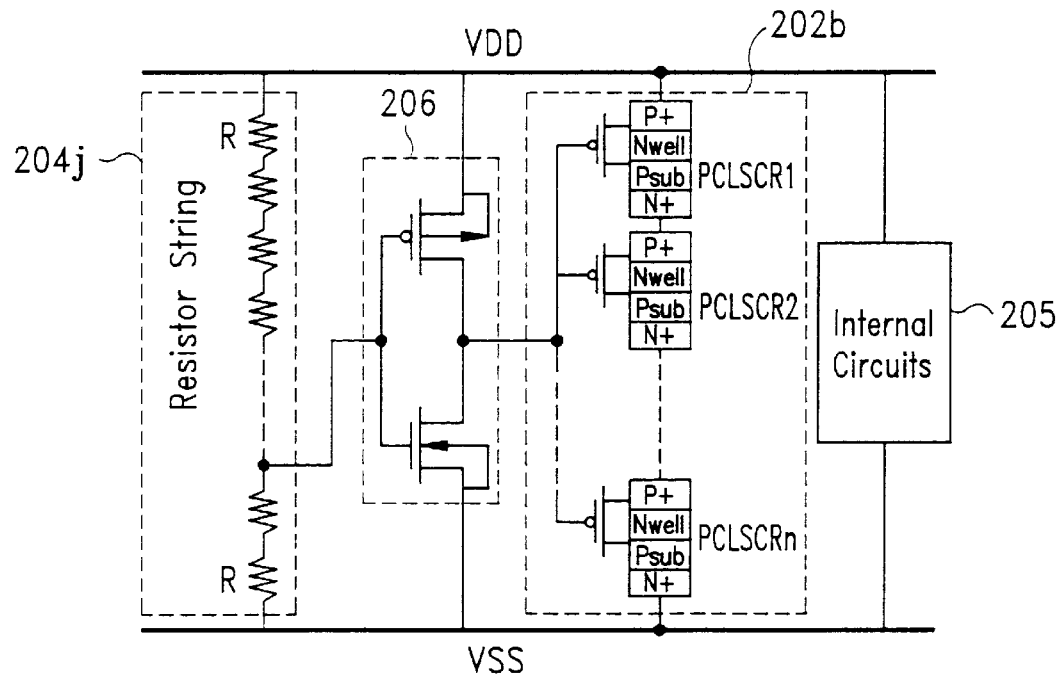
FIG. 16a illustrates an ESD protection circuit with a resistor string as the voltage-based ESD-detecting circuit.
Figure 16B:
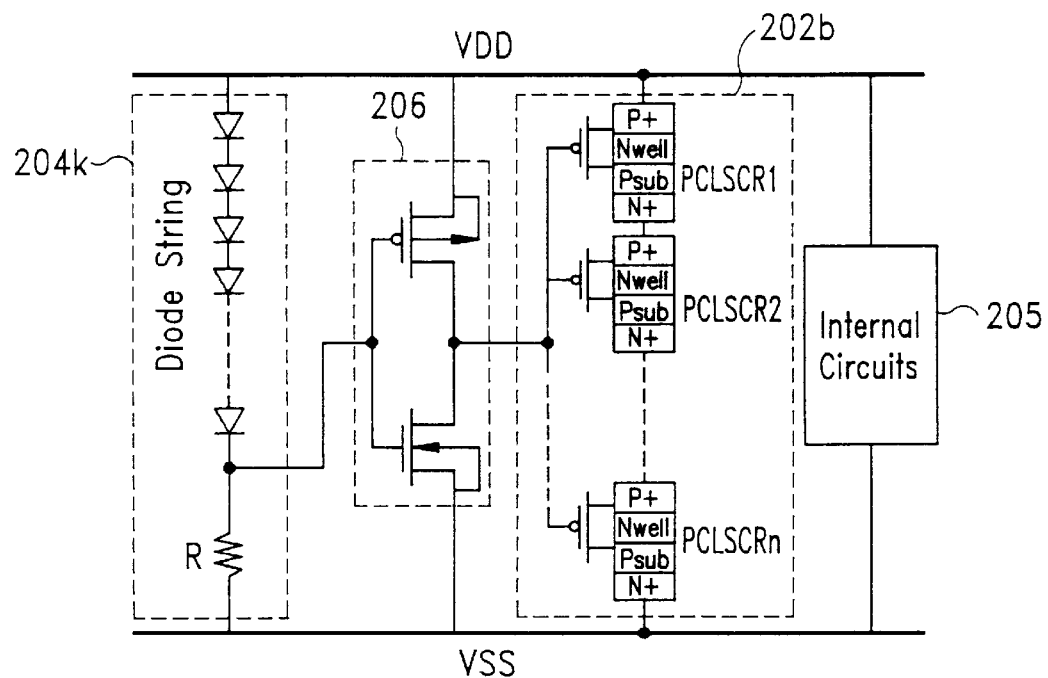
FIG. 16b illustrates an ESD protection circuit with a diode string as the voltage-based ESD-detecting circuit.
Figure 16C:
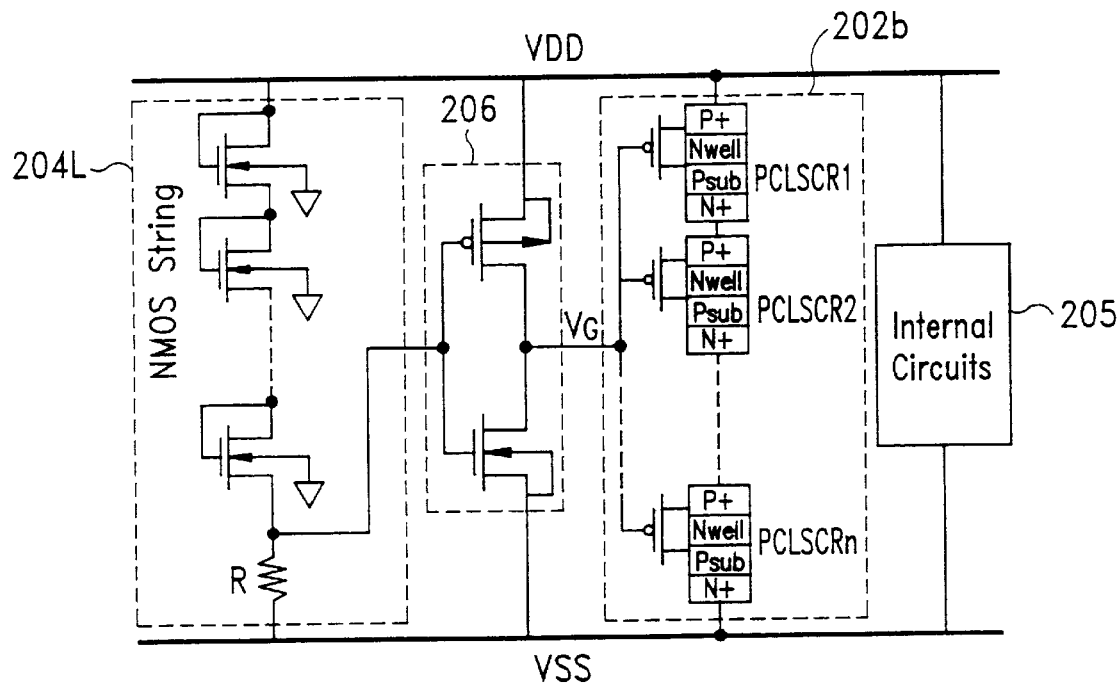
FIG. 16c illustrates an ESD protection circuit with a NMOS string as the voltage-based ESD-detecting circuit.
Figure 16D:
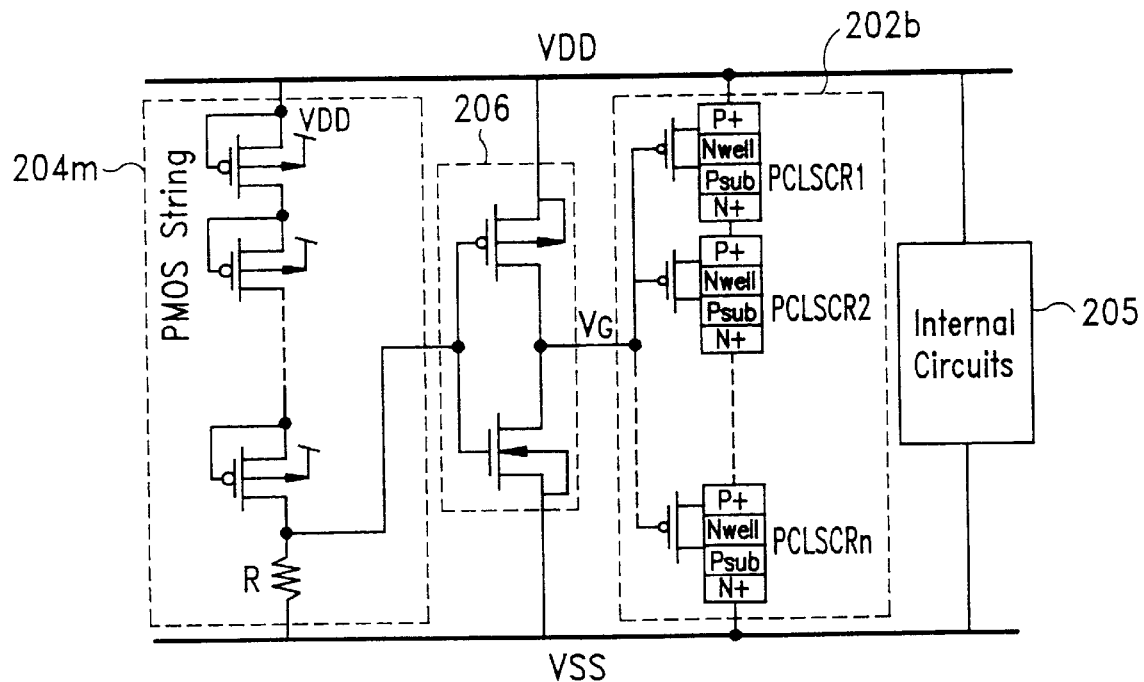
FIG. 16d illustrates an ESD protection circuit with a PMOS string as the voltage-based ESD-detecting circuit.
Figure 16E:
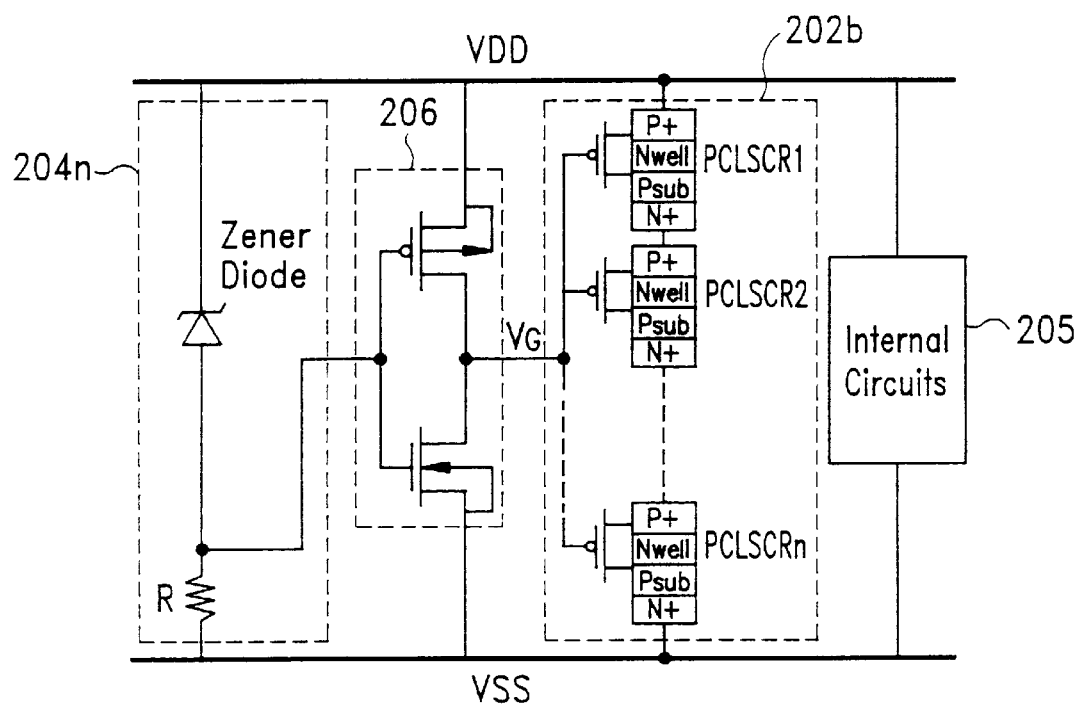
FIG. 16e illustrates an ESD protection circuit with a zener diode and a resistor as the voltage-based ESD-detecting circuit.

For a cascode LVTSCR 202b which includes the cascoding PCLSCRs as shown in FIG. 15a, a timing-based ESD-detecting circuit 204h including a RC-delay circuit can be used. An inverting circuit 206 can be added to invert the triggering signal from the detecting circuit 204h to the control gates of the cascoding PCLSCRs. The timing-based ESD-detecting circuit can also be a gate-coupled circuit 204i, as shown in FIG. 15b. Referring to FIG. 16a, a voltage-based ESD-detecting circuit 204j including a resistor string is employed. The voltage-based ESD-detecting circuit can also be a diode string 204k as shown in FIG. 16b. Referring to FIG. 16c, the voltage-based ESD-detecting circuit can be implemented by active devices like a NMOS string 204L. Alternatively, the voltage-based ESD-detecting circuit can be implemented by a PMOS string 204m in FIG. 16d. Another way to realize a voltage division is to use a zener diode and a resistor shown as 204n in FIG. 16e. Thus the electrostatic discharge (ESD) protection circuit is clamped to power supplies to bypass the ESD current and prevent damages to the internal circuits.

Figure 17:
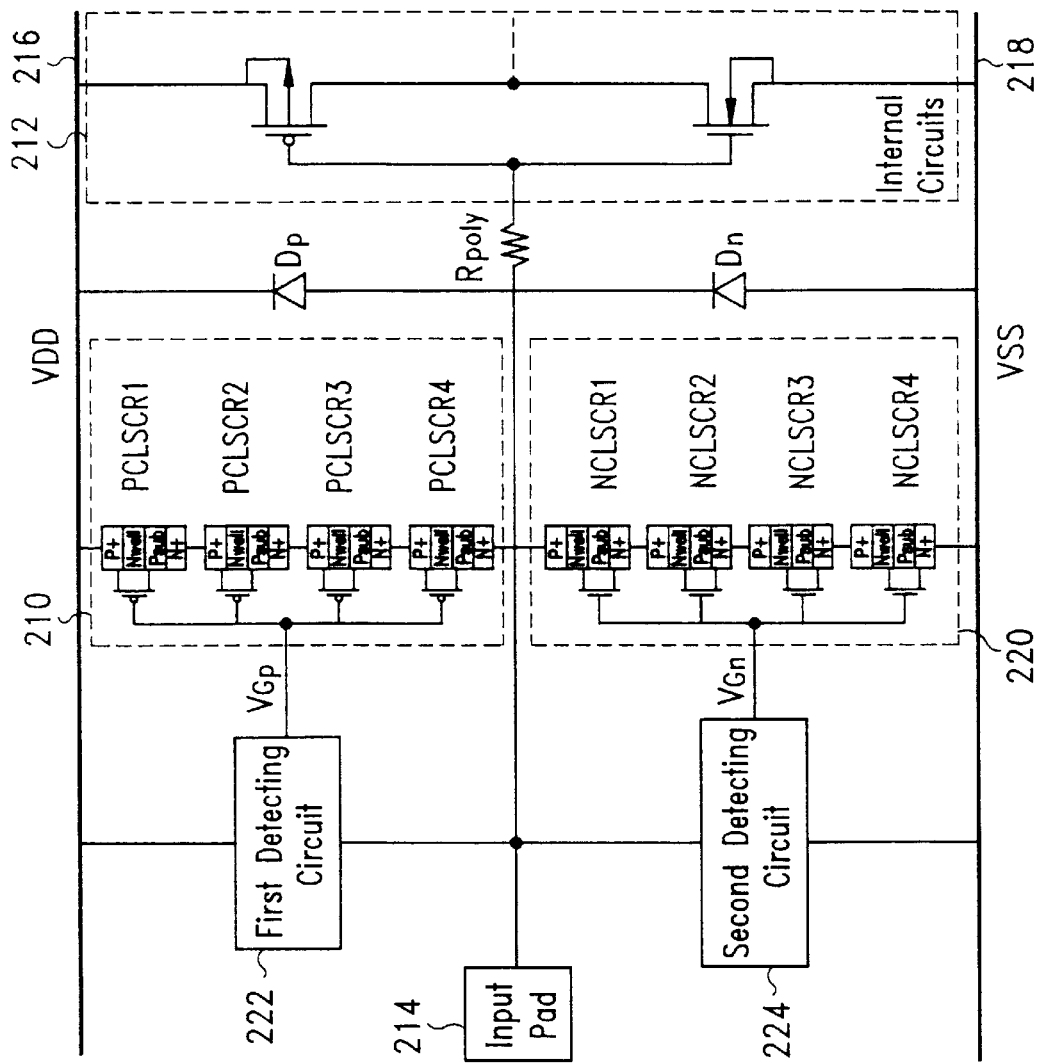
FIG. 17 illustrates an input ESD protection circuit in the present invention.

The cascode LVTSCR can be also applied to protect the input/output pads. Referring to FIG. 17, an electrostatic discharge (ESD) protection circuit for an input pad is illustrated. First protecting means 210 for protecting internal circuits is utilized to prevent an internal circuit 212 from negative electrostatic discharge coming from the input pad 214. The first protecting means 210 is coupled with a first voltage source 216 like VDD or positive voltage source and the input pad 214 by an anode and a cathode. Second protecting means 220 for protecting internal circuits 212 from positive electrostatic discharge coming from the input pad 214. The second protecting means 220 is coupled with a second voltage source 218 like VSS or ground connection and the input pad 214 by an anode and a cathode. First detecting means or circuit 222 is used for detecting negative electrostatic charge to trigger the first protecting means 210 to dissipate the negative electrostatic discharge. Second detecting means 224 is applied for detecting positive electrostatic charge to trigger the second protecting means 220 to dissipate the positive electrostatic discharge.

Figure 18:
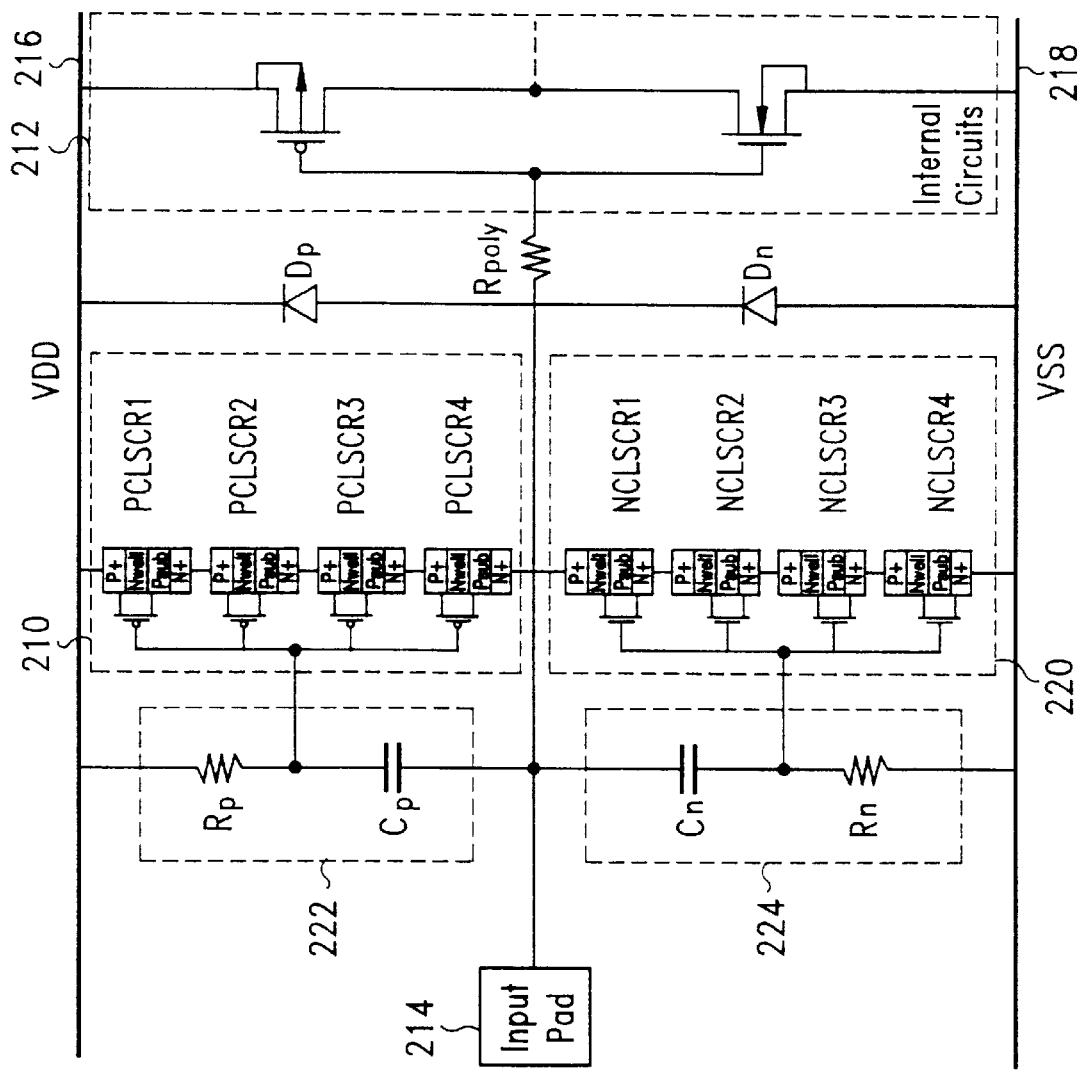
FIG. 18 illustrates an input ESD protection circuit in the present invention using gate-coupled technique.

As a detail embodiment, the first protecting means 210 can be a cascode LVTSCR including the cascoding PCLSCRs and the second protecting means 220 can be a cascode LVTSCR including the cascoding NCLSCRs. The first detecting means 222 and the second detecting means 224 can be implemented by timing-based ESD-detecting circuits or voltage-based ESD-detecting circuits as disclosed above. Thus the details of implementing the timing-based ESD-detecting circuits or the voltage-based ESD-detecting circuits are not described here. Referring to FIG. 18, an example of realizing timing-based ESD-detecting circuits by gate-coupled technique as the first detecting means 222 and the second detecting means 224 is shown. Any non-operational ESD current through the input pad 214 can be bypassed by the first protecting means 210 or the second protecting means 220 with the triggering of the first detecting means 222 or the second detecting means 224. With the raised holding voltage and the design of the circuit, the unexpected turn-on event of the conventional ESD protection circuit can be overcome without causing any input signal error.

Figure 19:
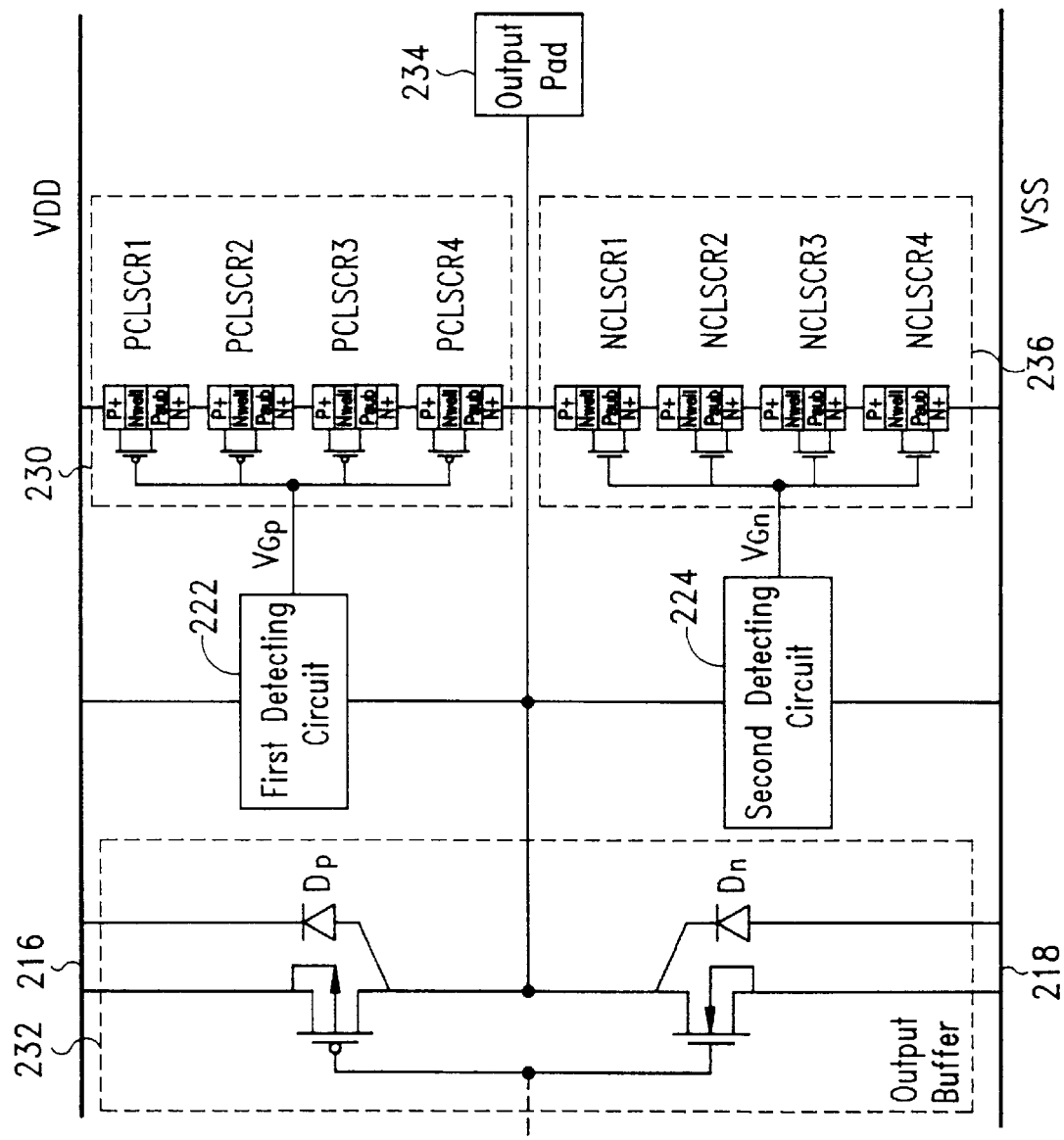
FIG. 19 illustrates an output ESD protection circuit in the present invention.

In the same way, the electrostatic discharge (ESD) protection circuit can be applied on an output pad, as shown in FIG. 19. First protecting means 230 for protecting internal circuits is utilized to prevent an internal circuit or an output buffer 232 from negative electrostatic discharge coming from the output pad 234. The first protecting means 230 is coupled with a first voltage source 216 like VDD or positive voltage source and the output pad 234 with an anode and a cathode. Second protecting means 236 for protecting internal circuits is applied to prevent the internal circuit or the output buffer 232 from positive electrostatic discharge coming from the output pad 234. The second protecting means 236 is coupled between the output pad 234 and a second voltage source 218 like VSS or ground connection with an anode and a cathode. First detecting means 222 and second detecting means 224 are applied in the same way for detecting electrostatic charge to trigger the first and the second protecting means 230 and 236 to dissipate the electrostatic discharge.

Figure 20:
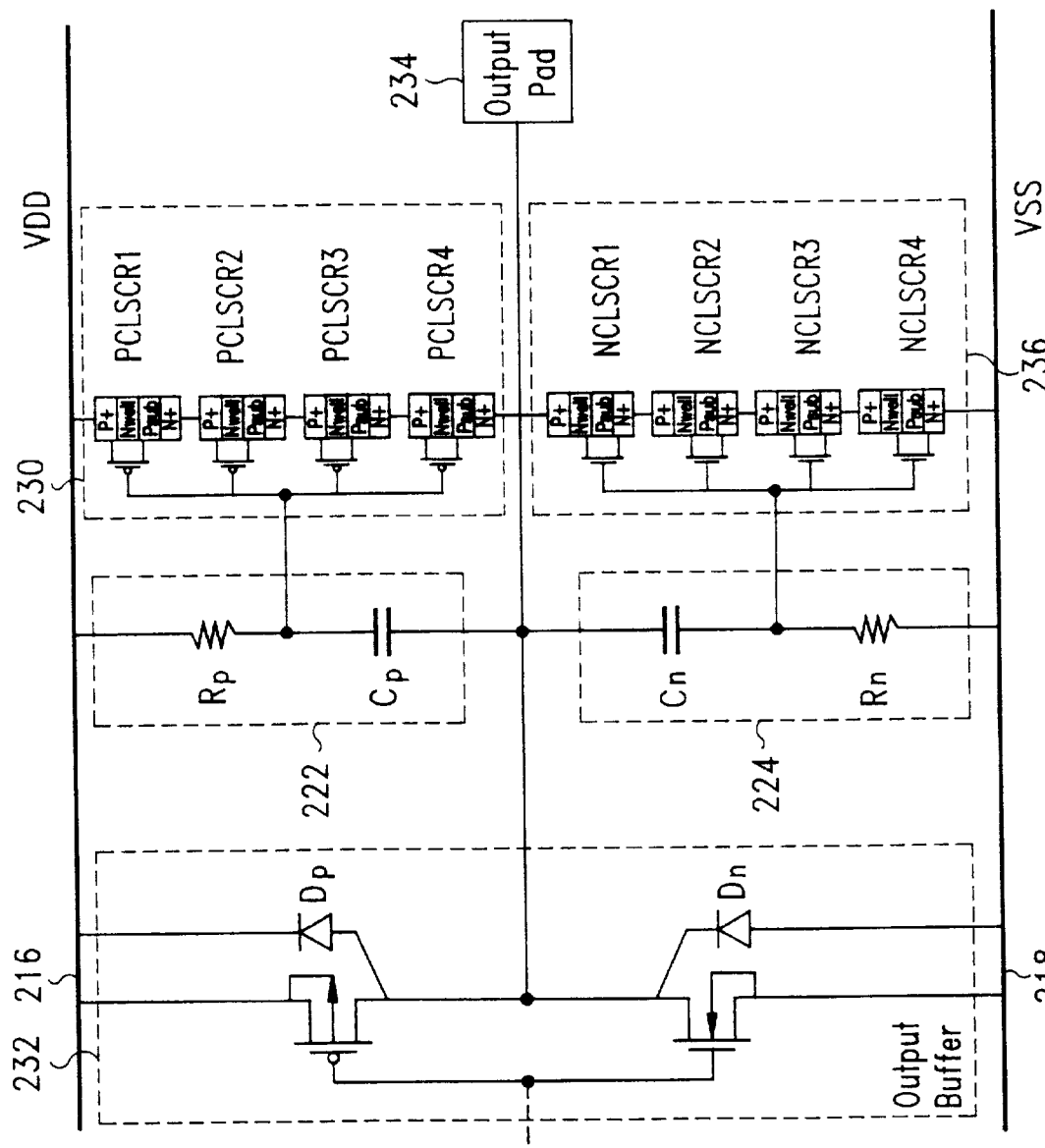
FIG. 20 illustrates an output ESD protection circuit in the present invention using gate-coupled technique.

As a detail embodiment, the first protecting means 230 can be a cascode LVTSCR including the cascoding PCLSCRs and the second protecting means 236 can be a cascode LVTSCR including the cascoding NCLSCRs. The first detecting means 222 and the second detecting means 224 can be implemented by timing-based ESD-detecting circuits or voltage-based ESD-detecting circuits as disclosed above. Referring to FIG. 20, an example of realizing timing-based ESD-detecting circuits by gate-coupled technique in the first detecting means 222 and the second detecting means 224 is shown. Any non-operational ESD current through the output pad 234 can be bypassed by the first protecting means 230 or the second protecting means 220 with the triggering of the first detecting means 222 or the second detecting means 224. With the raised holding voltage and the design of the circuit, the unexpected turn-on event of the conventional ESD protection circuit can be overcome without causing any output signal error.

Figure 21A:
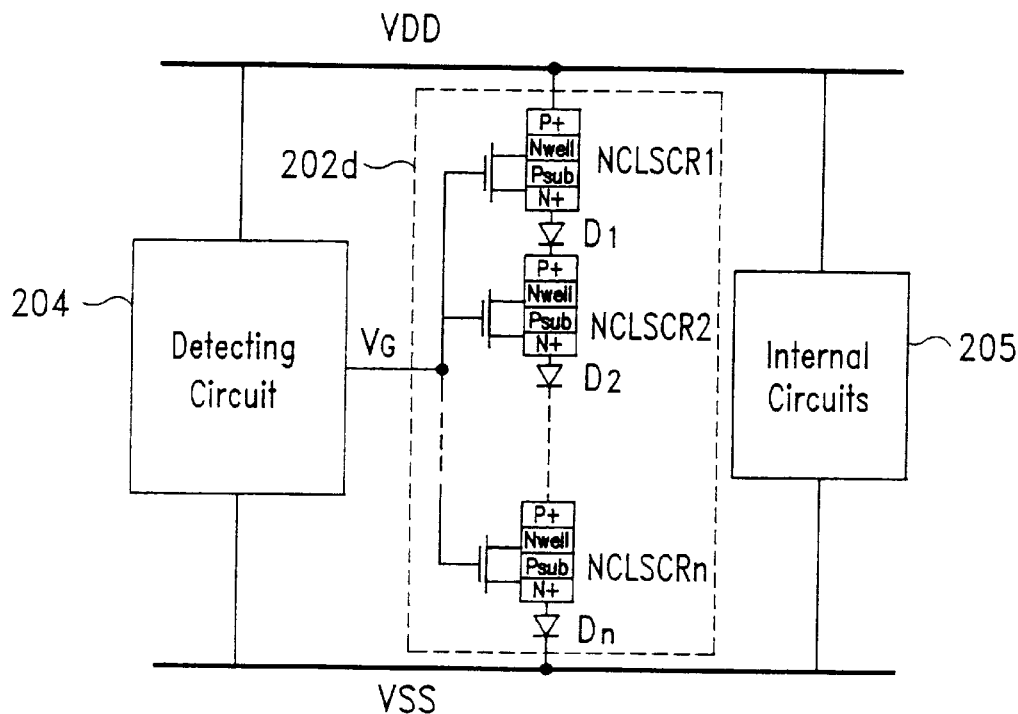
FIG. 21a illustrates an ESD protection circuit with the diodes added between NCLSCRs.
Figure 21B:
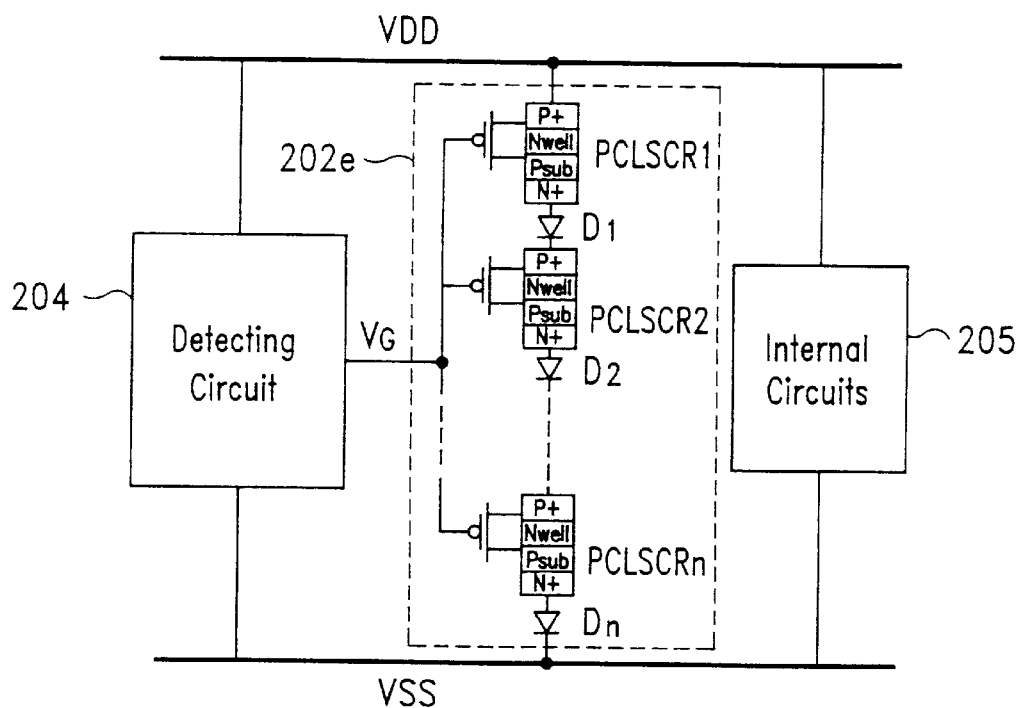
FIG. 21b illustrates an ESD protection circuit with the diodes added between PCLSCRs.
Figure 21C:
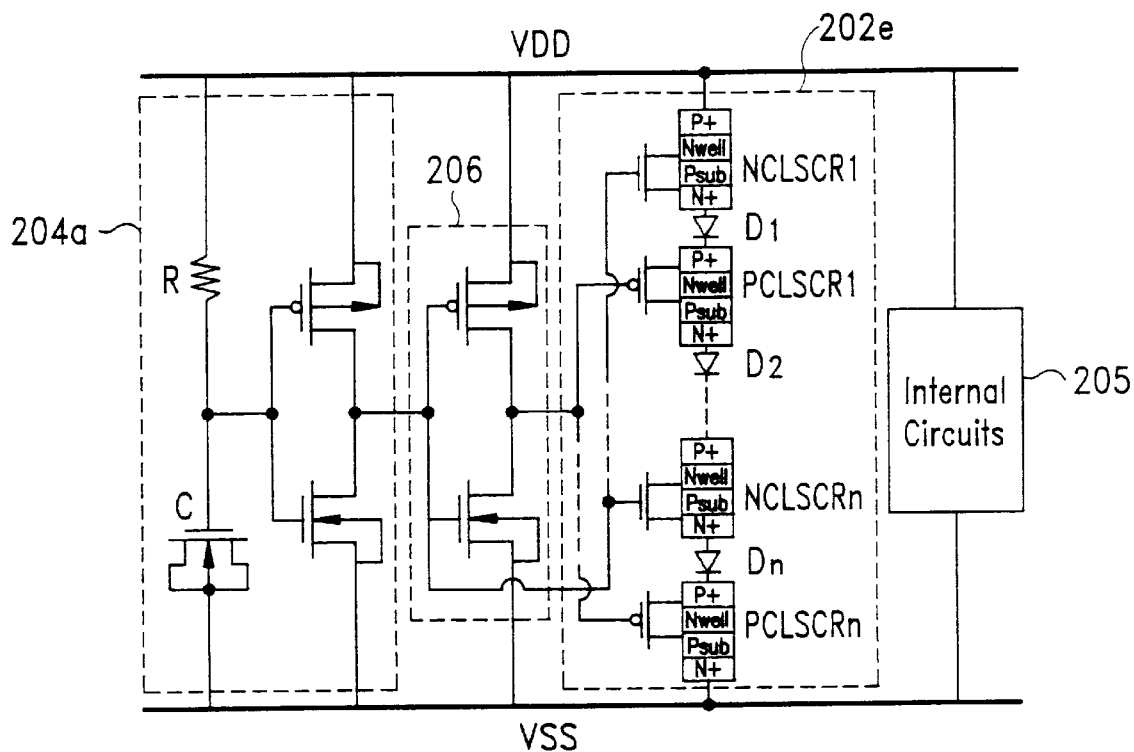
FIG. 21c illustrates an ESD protection circuit with the diodes added between the mixed NCLSCRs and PCLSCRs.
Figure 21D:
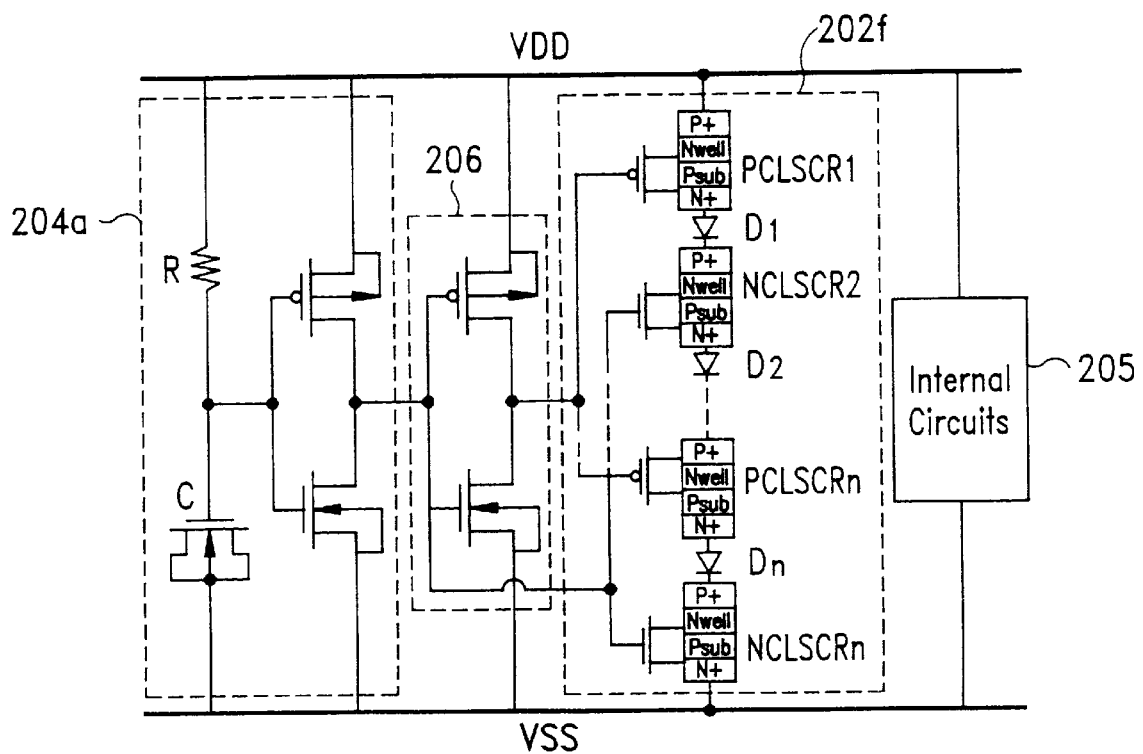
FIG. 21d illustrates an ESD protection circuit with the diodes added between the mixed NCLSCRs and PCLSCRs with a variation in sequence.

In another way, the cascode LVTSCR can be implemented with diodes added between the NCLSCRs and/or the PCLSCRs. Referring to FIG. 21a, the protecting circuit can be realized by the LVTSCR 202d with diodes D1 to Dn inserted between the NCLSCRs. The protecting circuit can also be realized by the LVTSCR 202e with diodes D1 to Dn inserted between the PCLSCRs, as shown in FIG. 21b. Referring to FIG. 21c, the protecting circuit can also be realized by the LVTSCR 202e with diodes D1 to Dn inserted between the mixed PCLSCRs and NCLSCRs. FIG. 21d illustrates a change in the cascoding sequence of the PCLSCRs and the NCLSCRs as an equivalent variation 202f.

Figure 22:
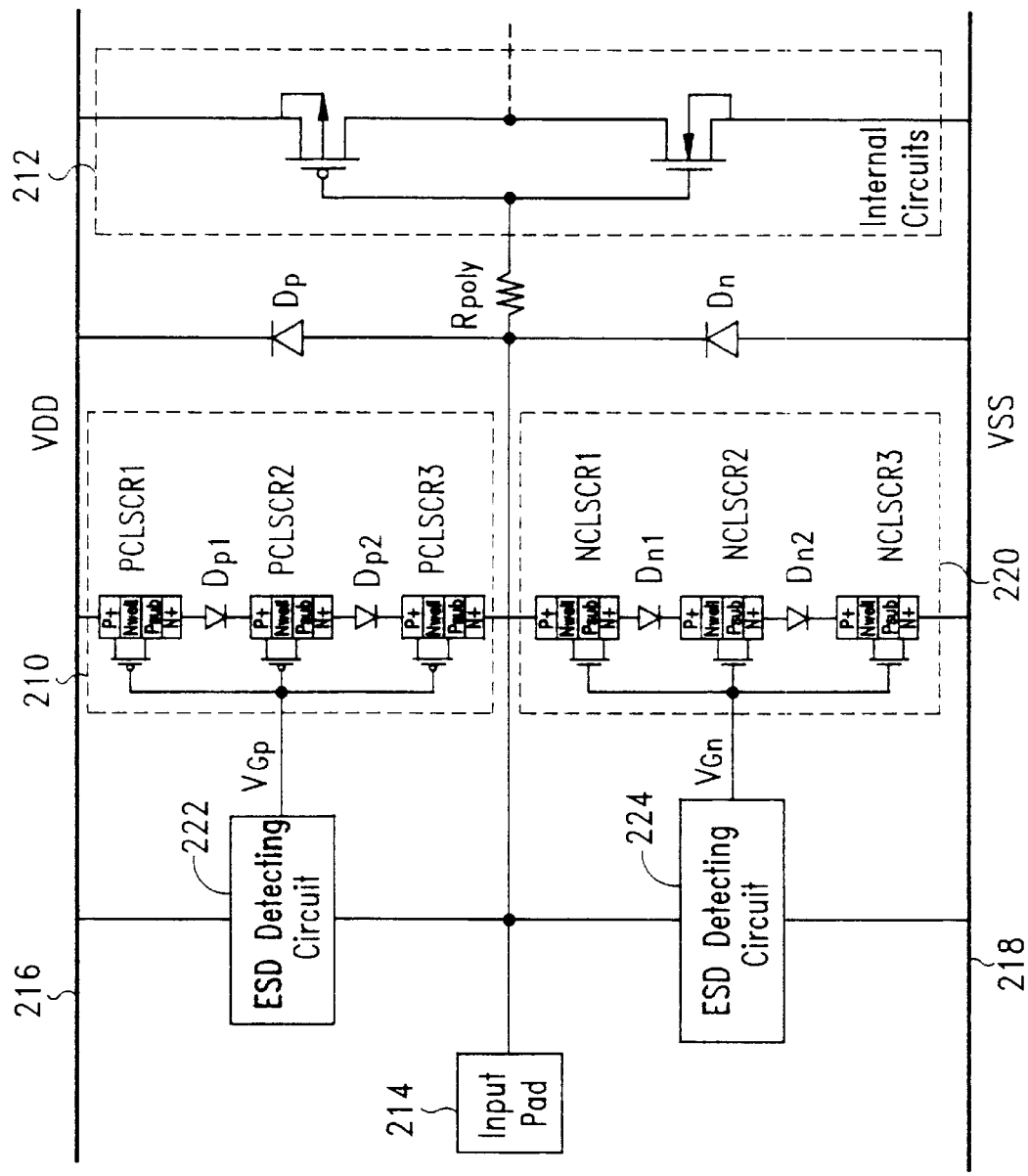
FIG. 22 illustrates an input ESD protection circuit with the diodes added between NCLSCRs and PCLSCRs.
Figure 23:
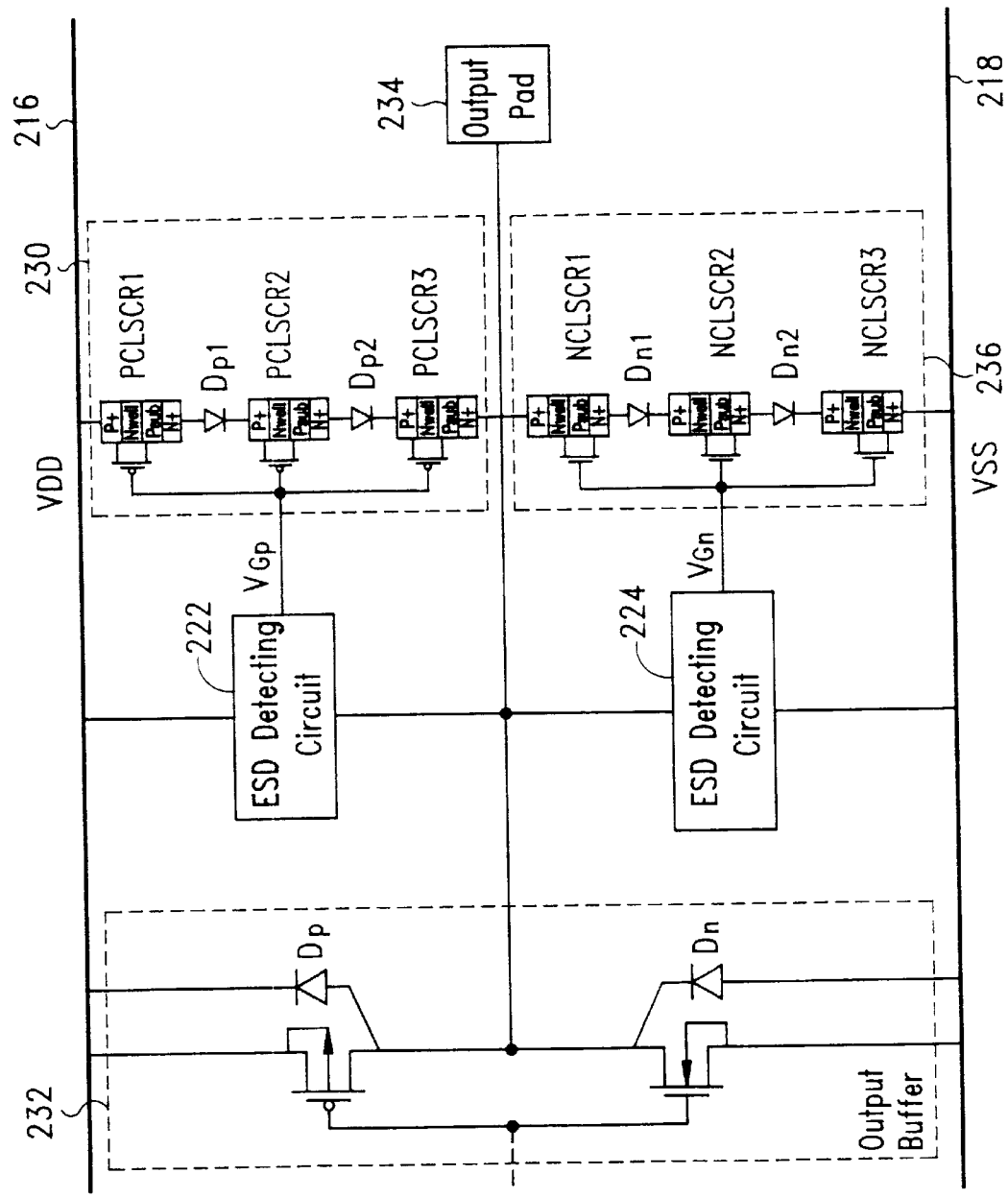
FIG. 23 illustrates an output ESD protection circuit with the diodes added between NCLSCRs and PCLSCRs.

Equivalently, the first protecting circuit 210 and the second protecting circuit 220 can also be implemented with diodes Dp1 to Dp2 and Dn1 to Dn2 inserted respectively between the PCLSCRs and the NCLSCRs for protecting ESD from the input pad 214, as shown in FIG. 22. Diodes Dp1 to Dp2 and Dn1 to Dn2 can be cascaded respectively between the PCLSCRs and the NCLSCRs in the first protecting circuit 230 and the second protecting circuit 236 for protecting ESD from the output buffer 232, as shown in FIG. 23.

The present invention discloses a cascode LVTSCR to linearly adjust the holding voltage of the device. The cascode LVTSCR includes cascoding NCLSCRs, PCLSCRs, or combination thereof. The cascode LVTSCR can be used in the ESD protection circuit. With a holding voltage greater than VDD of the CMOS IC, the proposed cascode LVTSCR can provide effective ESD protection with the ESD level as high as that of the conventional device. The cascode LVTSCR is free of the accidental trigger-on event or the VDD-to-VSS latchup problem when the IC is in the normal operating conditions or in the system-level ESD/EMC reliability tests.

The danger of the conventional application of LVTSCR in ESD protection circuit can be eliminated with high ESD protection capability to bypass the ESD current. The advantages of high ESD bypassing ability are achieved without the disadvantage or the danger of low holding voltage.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A cascode LVTSCR (low-voltage triggering silicon controlled rectifier), said cascode LVTSCR comprising:
    a first MOS-controlled SCR (silicon controlled rectifier) having a first anode, a first control gate, and a first cathode; and
    a second MOS-controlled SCR having a second anode, a second control gate, and a second cathode, said second SCR being cascoded with said first MOS-controlled SCR by coupling said second anode with said first cathode and by coupling said first control gate and said second control gate, said second anode and said first cathode being coupled without having an external connection.

2. The cascode LVTSCR of claim 1, wherein said first MOS-controlled SCR and said second MOS-controlled SCR are selected from the group consisting of NCLSCRs (NMOS-controlled lateral SCRs), PCLSCRs (PMOS-controlled lateral SCRs), and combination thereof, said control gates of same type SCRs being coupled commonly.

3. A cascode LVTSCR (low-voltage triggering silicon controlled rectifier), said cascode LVTSCR comprises:
    at least two MOS-controlled SCRs (silicon controlled rectifiers), each of said at least two SCRs having an anode, a control gate, and a cathode, each of said at least two SCRs being made by inserting a MOS device into a lateral SCR device, said at least two SCRs being cascoded in series by coupling said control gates of same type SCRs in common and coupling said cathode of one of said at least two SCRs to said anode of next said at least two SCRs, said cathode of one of said at least two SCRs and said anode of next said at least two SCRs being coupled without having an external connection.

4. The cascode LVTSCR of claim 3, wherein said at least two SCRs are selected from the group consisting of NCLSCRs (NMOS-controlled lateral SCRs), PCLSCRs (PMOS-controlled lateral SCRs), and combination thereof.

5. An electrostatic discharge (ESD) protection circuit comprising:
    means for protecting internal circuits from electrostatic discharge coming from power supplies, said protecting means comprising a cascode LVTSCR (low-voltage triggering silicon controlled rectifier), said cascode LVTSCR comprising at least two MOS-controlled SCRs (silicon controlled rectifiers), each of said at least two SCRs having an anode, a control gate, and a cathode, each of said at least two SCRs being made by inserting a MOS device into a lateral SCR device, said at least two SCRs being cascoded in series by coupling said control gates of same type SCRs in common and coupling said cathode of one of said at least two SCRs to said anode of next said at least two SCRs, said cathode of one of said at least two SCRs and said anode of next said at least two SCRs being coupled without having an external connection, said at least two SCRs being selected from the group consisting of NCLSCRs (NMOS-controlled lateral SCRs), PCLSCRs (PMOS-controlled lateral SCRs), and combination thereof; and
    means for detecting electrostatic charge to trigger said protecting means to dissipate said electrostatic discharge.

6. The electrostatic discharge protection circuit of claim 5, wherein said power supplies comprise at least two voltage sources.

7. The electrostatic discharge protection circuit of claim 5, wherein said cascode LVTSCR further comprises diodes inserted between said NCLSCRs and/or said PCLSCRs.

8. The electrostatic discharge protection circuit of claim 5, wherein said electrostatic discharge protection circuit further comprises an inverting circuit coupled between said electrostatic charge detecting means and said control gates of said PCLSCRs.

9. The electrostatic discharge protection circuit of claim 5, wherein said detecting means comprise a timing-based ESD-detecting circuit.

10. The electrostatic discharge protection circuit of claim 9, wherein said timing-based ESD-detecting circuit comprises a RC-delay circuit.

11. The electrostatic discharge protection circuit of claim 9, wherein said timing-based ESD-detecting circuit comprises a gate-coupled circuit.

12. The electrostatic discharge protection circuit of claim 5, wherein said detecting means comprises a voltage-based ESD-detecting circuit to realize a voltage division.

13. The electrostatic discharge protection circuit of claim 12, wherein said voltage-based ESD-detecting circuit comprises a resistor string.

14. The electrostatic discharge protection circuit of claim 12, wherein said voltage-based ESD-detecting circuit comprises a diode string.

15. The electrostatic discharge protection circuit of claim 12, wherein said voltage-based ESD-detecting circuit comprises a NMOS string.

16. The electrostatic discharge protection circuit of claim 12, wherein said voltage-based ESD-detecting circuit comprises a PMOS string.

17. The electrostatic discharge protection circuit of claim 12, wherein said voltage-based ESD-detecting circuit comprises a zener diode.

18. An electrostatic discharge (ESD) protection circuit for an input/output pad, said electrostatic discharge protection circuit comprising:
first means for protecting internal circuits to prevent an internal circuit from negative electrostatic discharge coming from said input/output pad, said first protecting means being coupled between a first voltage source and said input/output pad, said first protecting means comprising a first cascode LVTSCR (low-voltage triggering silicon controlled rectifier);
second means for protecting internal circuits to prevent said internal circuit from positive electrostatic discharge coming from said input/output pad, said second protecting means being coupled between said input/output pad and a second voltage source, said second protecting means comprising a second cascode LVTSCR, each of said first and second cascode LVTSCRs comprising at least two MOS-controlled SCRs (silicon controlled rectifiers), each of said at least two SCRs having an anode, a control gate, and a cathode, each of said at least two SCRs being made by inserting a MOS device into a lateral SCR device, said at least two SCRs being cascoded in series by coupling said control gates of same type SCRs in common and coupling said cathode of one of said at least two SCRs to said anode of next said at least two SCRs, said cathode of one of said at least two SCRs and said anode of next said at least two SCRs being coupled without having an external connection, said at least two SCRs being selected from the group consisting of NCLSCRs (NMOS-controlled lateral SCRs), PCLSCRs (PMOS-controlled lateral SCRs), and combination thereof;
first means for detecting electrostatic charge to trigger said first protecting means to dissipate said negative electrostatic discharge; and
second means for detecting electrostatic charge to trigger said second protecting means to dissipate said positive electrostatic discharge.

19. The electrostatic discharge protection circuit of claim 18, wherein said first voltage source comprises a positive voltage source and said second voltage comprises a ground connection.

20. The electrostatic discharge protection circuit of claim 18, wherein said cascode LVTSCR further comprises diodes inserted between said NCLSCRs and/or said PCLSCRs.

21. The electrostatic discharge protection circuit of claim 18, wherein said electrostatic discharge protection circuit further comprises an inverting circuit coupled between said electrostatic charge detecting means and said control gates of said PCLSCRs.

22. The electrostatic discharge protection circuit of claim 18, wherein said first detecting means and said second detecting means comprise timing-based ESD-detecting circuits.

23. The electrostatic discharge protection circuit of claim 22, wherein said timing-based ESD-detecting circuits comprise RC-delay circuits.

24. The electrostatic discharge protection circuit of claim 22, wherein said timing-based ESD-detecting circuits comprise gate-coupled circuits.

25. The electrostatic discharge protection circuit of claim 18, wherein said first detecting means and said second detecting means comprise voltage-based ESD-detecting circuits to realize voltage division.

26. The electrostatic discharge protection circuit of claim 25, wherein said voltage-based ESD-detecting circuits comprise resistor string.

27. The electrostatic discharge protection circuit of claim 25, wherein said voltage-based ESD-detecting circuits comprise diode string.

28. The electrostatic discharge protection circuit of claim 25, wherein said voltage-based ESD-detecting circuits comprise NMOS string.

29. The electrostatic discharge protection circuit of claim 25, wherein said voltage-based ESD-detecting circuits comprise PMOS string.

30. The electrostatic discharge protection circuit of claim 25, wherein said voltage-based ESD-detecting circuits comprise zener diodes.

31. An electrostatic discharge (ESD) protection circuit comprising:
a cascode LVTSCR (low-voltage triggering silicon controlled rectifier) having a first anode and a last cathode coupled between power supplies, said cascode LVTSCR comprising at least two MOS-controlled SCRs (silicon controlled rectifiers), each of said at least two SCRs having an anode, a control gate, and a cathode, each of said at least two SCRs being made by inserting a MOS device into a lateral SCR device, said at least two SCRs being cascoded in series by coupling said control gates of same type SCRs in common and coupling said cathode of one of said at least two SCRs to said anode of next said at least two SCRs, said cathode of one of said at least two SCRs and said anode of next said at least two SCRs being coupled without having an external connection, said at least two SCRs being selected from the group consisting of NCLSCRs (NMOS-controlled lateral SCRs), PCLSCRs (PMOS-controlled lateral SCRs), and combination thereof; and
a detecting circuit coupled between said power supplies for detecting an electrostatic charge to trigger control gates of said at least two SCRs for dissipating said electrostatic discharge.

32. The electrostatic discharge protection circuit of claim 31, wherein said power supplies comprise at least two voltage sources.

33. The electrostatic discharge protection circuit of claim 31, wherein said cascode LVTSCR further comprises diodes inserted between said NCLSCRs and/or said PCLSCRs.

34. The electrostatic discharge protection circuit of claim 31, wherein said electrostatic discharge protection circuit further comprises an inverting circuit coupled between said detecting circuit and said PCLSCRs.

35. The electrostatic discharge protection circuit of claim 31, wherein said detecting circuit comprises a timing-based ESD-detecting circuit.

36. The electrostatic discharge protection circuit of claim 35, wherein said timing-based ESD-detecting circuit comprises a RC-delay circuit.

37. The electrostatic discharge protection circuit of claim 35, wherein said timing-based ESD-detecting circuit comprises a gate-coupled circuit.

38. The electrostatic discharge protection circuit of claim 31, wherein said detecting circuit comprises a voltage-based ESD-detecting circuit to realize a voltage division.

39. The electrostatic discharge protection circuit of claim 38, wherein said voltage-based ESD-detecting circuit comprises a resistor string.

40. The electrostatic discharge protection circuit of claim 38, wherein said voltage-based ESD-detecting circuit comprises a diode string.

41. The electrostatic discharge protection circuit of claim 38, wherein said voltage-based ESD-detecting circuit comprises a NMOS string.

42. The electrostatic discharge protection circuit of claim 38, wherein said voltage-based ESD-detecting circuit comprises a PMOS string.

43. The electrostatic discharge protection circuit of claim 38, wherein said voltage-based ESD-detecting circuit comprises a zener diode.

44. An electrostatic discharge (ESD) protection circuit for an input/output pad, said electrostatic discharge protection circuit comprising:

a first cascode LVTSCR (low-voltage triggering silicon controlled rectifier) for protecting an internal circuit from a negative electrostatic discharge coming from said input/output pad, said first cascode LVTSCR having a first anode and a last cathode coupled between a first voltage source and said input/output pad;

a second cascode LVTSCR for protecting an internal circuit from a positive electrostatic discharge coming from said input/output pad, said second cascode LVTSCR having a first anode and a last cathode coupled between said input/output pad and a second voltage source, each of said first cascode LVTSCR and said second cascode LVTSCR comprising at least two MOS-controlled SCRs (silicon controlled rectifiers), each of said at least two SCRs having an anode, a control gate, and a cathode, each of said at least two SCRs being made by inserting a MOS device into a lateral SCR device, said at least two SCRs being cascoded in series by coupling said control gates of same type SCRs in common and coupling said cathode of one of said at least two SCRs to said anode of next said at least two SCRs, said cathode of one of said at least two SCRs and said anode of next said at least two SCRs being coupled without having an external connection, said at least two SCRs being selected from the group consisting of NCLSCRs (NMOS-controlled lateral SCRs), PCLSCRs (PMOS-controlled lateral SCRs), and combination thereof;

a first detecting circuit coupled between said first voltage source and said input/output pad for detecting said negative electrostatic charge to trigger control gates of said first cascode LVTSCR to dissipate said negative electrostatic discharge; and a second detecting circuit coupled between said second voltage source and said input/output pad for detecting said positive electrostatic charge to trigger control gates of said second cascode LVTSCR to dissipate said positive electrostatic discharge.

45. The electrostatic discharge protection circuit of claim 44, wherein said first voltage source supplies a higher voltage then said second voltage source.

46. The electrostatic discharge protection circuit of claim 44, wherein said cascode LVTSCR further comprises diodes inserted between said NCLSCRs and/or said PCLSCRs.

47. The electrostatic discharge protection circuit of claim 44, wherein said electrostatic discharge protection circuit further comprises an inverting circuit coupled between said detecting circuit and said PCLSCRs.

48. The electrostatic discharge protection circuit of claim 44, wherein said first detecting circuit and said second detecting circuit comprise timing-based ESD-detecting circuits.

49. The electrostatic discharge protection circuit of claim 48, wherein said timing-based ESD-detecting circuits comprise RC-delay circuits.

50. The electrostatic discharge protection circuit of claim 48, wherein said timing-based ESD-detecting circuits comprise gate-coupled circuits.

51. The electrostatic discharge protection circuit of claim 44, wherein said first detecting circuit and said second detecting circuit comprise voltage-based ESD-detecting circuits to realize voltage division.

52. The electrostatic discharge protection circuit of claim 51, wherein said voltage-based ESD-detecting circuits comprise resistor string.

53. The electrostatic discharge protection circuit of claim 51, wherein said voltage-based ESD-detecting circuits comprise diode string.

54. The electrostatic discharge protection circuit of claim 51, wherein said voltage-based ESD-detecting circuits comprise NMOS string.

55. The electrostatic discharge protection circuit of claim 51, wherein said voltage-based ESD-detecting circuits comprise PMOS string.

56. The electrostatic discharge protection circuit of claim 51, wherein said voltage-based ESD-detecting circuits comprise zener diodes.

* * * * *